(12) United States Patent
Fujiki et al.

(10) Patent No.: US 8,828,646 B2
(45) Date of Patent: Sep. 9, 2014

(54) LITHOGRAPHIC PRINTING PLATE PRECURSOR AND METHOD OF PRODUCING THEREOF

(75) Inventors: Yuzo Fujiki, Haibara-gun (JP); Shota Suzuki, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 13/637,278

(22) PCT Filed: Mar. 15, 2011

(86) PCT No.: PCT/JP2011/056087
§ 371 (c)(1),
(2), (4) Date: Sep. 25, 2012

(87) PCT Pub. No.: WO2011/118457
PCT Pub. Date: Sep. 29, 2011

(65) Prior Publication Data
US 2013/0017485 A1    Jan. 17, 2013

(30) Foreign Application Priority Data

Mar. 26, 2010  (JP) ................. 2010-073870
Jul. 30, 2010  (JP) ................. 2010-173189

(51) Int. Cl.
| B41M 5/00 | (2006.01) |
| B41N 1/00 | (2006.01) |
| G03F 7/00 | (2006.01) |
| G03F 7/26 | (2006.01) |
| B41C 1/10 | (2006.01) |
| G03F 7/11 | (2006.01) |
| G03F 7/30 | (2006.01) |

(52) U.S. Cl.
CPC ........... *B41C 1/1016* (2013.01); *G03F 7/11* (2013.01); *G03F 7/3035* (2013.01); *B41C 2201/02* (2013.01); *B41C 2210/08* (2013.01)

USPC .......... 430/271.1; 430/270.1; 430/273.1; 430/281.1; 430/283.1; 430/302; 101/453; 101/463.1

(58) Field of Classification Search
USPC .......... 430/270.1, 302; 101/450.1, 453, 463.1
See application file for complete search history.

(56) References Cited

U.S. PATENT DOCUMENTS 5,273,862 A * 12/1993 Zertani et al. ............. 430/273.1
6,649,323 B2   11/2003 Pappas et al.
(Continued)

FOREIGN PATENT DOCUMENTS

CN   1 354 394 A   6/2002
CN   101 426 659 A   5/2009
(Continued)

OTHER PUBLICATIONS

International Search Report issued in PCT/JP2011/056087, dated Apr. 12, 2011.

(Continued)

*Primary Examiner* — Chanceity Robinson
(74) *Attorney, Agent, or Firm* — Birch, Stewart, Kolasch & Birch, LLP

(57) ABSTRACT

To provide a lithographic printing plate precursor which is excellent in the gum development property, running processing property and scratch resistance and a lithographic printing plate precursor which is good in all performances of the on-press development property, ink receptivity, sensitivity and printing durability, and a method of producing thereof. A lithographic printing plate precursor has a support, an image-recording layer containing a radical polymerization initiator and a radical polymerizable compound, and an overcoat layer containing a polymer resin which has a cloud point in an aqueous solution and includes a monomer unit containing at least any of an amino group and an amido bond, in this order.

8 Claims, 1 Drawing Sheet

(56) References Cited

U.S. PATENT DOCUMENTS

| | | |
|---|---|---|
| 2001/0018159 A1 | 8/2001 | Maemoto |
| 2002/0010264 A1 | 1/2002 | Pappas et al. |
| 2002/0177074 A1 | 11/2002 | Hoshi et al. |
| 2003/0064318 A1 | 4/2003 | Huang et al. |
| 2003/0124317 A1* | 7/2003 | Zheng et al. .................. 428/195 |
| 2004/0106060 A1 | 6/2004 | Maemoto |
| 2004/0214105 A1 | 10/2004 | Hoshi et al. |
| 2004/0224258 A1 | 11/2004 | Maemoto |
| 2004/0234883 A1 | 11/2004 | Maemoto |
| 2005/0069811 A1* | 3/2005 | Mitsumoto et al. ........ 430/270.1 |
| 2008/0145789 A1 | 6/2008 | Knight |
| 2009/0087779 A1 | 4/2009 | Mori |

FOREIGN PATENT DOCUMENTS

| | | |
|---|---|---|
| EP | 0 352 630 A3 | 1/1990 |
| JP | 2-103051 A | 4/1990 |
| JP | 2001-277740 A | 10/2001 |
| JP | 2001-277742 A | 10/2001 |
| JP | 2002-287334 A | 10/2002 |
| JP | 2005-119273 A | 5/2005 |
| JP | 2005-271284 A | 10/2005 |
| JP | 2008-284858 A | 11/2008 |
| JP | 2009-56733 A | 3/2009 |

OTHER PUBLICATIONS

Form PCT/ISA/237 mailed Apr. 12, 2011, for International Application No. PCT/JP2011/056087 with English translation.

Extended European Search Report dated Mar. 18, 2014 for European Application No. 11759263.4.

Chinese Office Action issued in Chinese Patent Application No. 201180016323.4 on May 12, 2014 with English Translation.

* cited by examiner

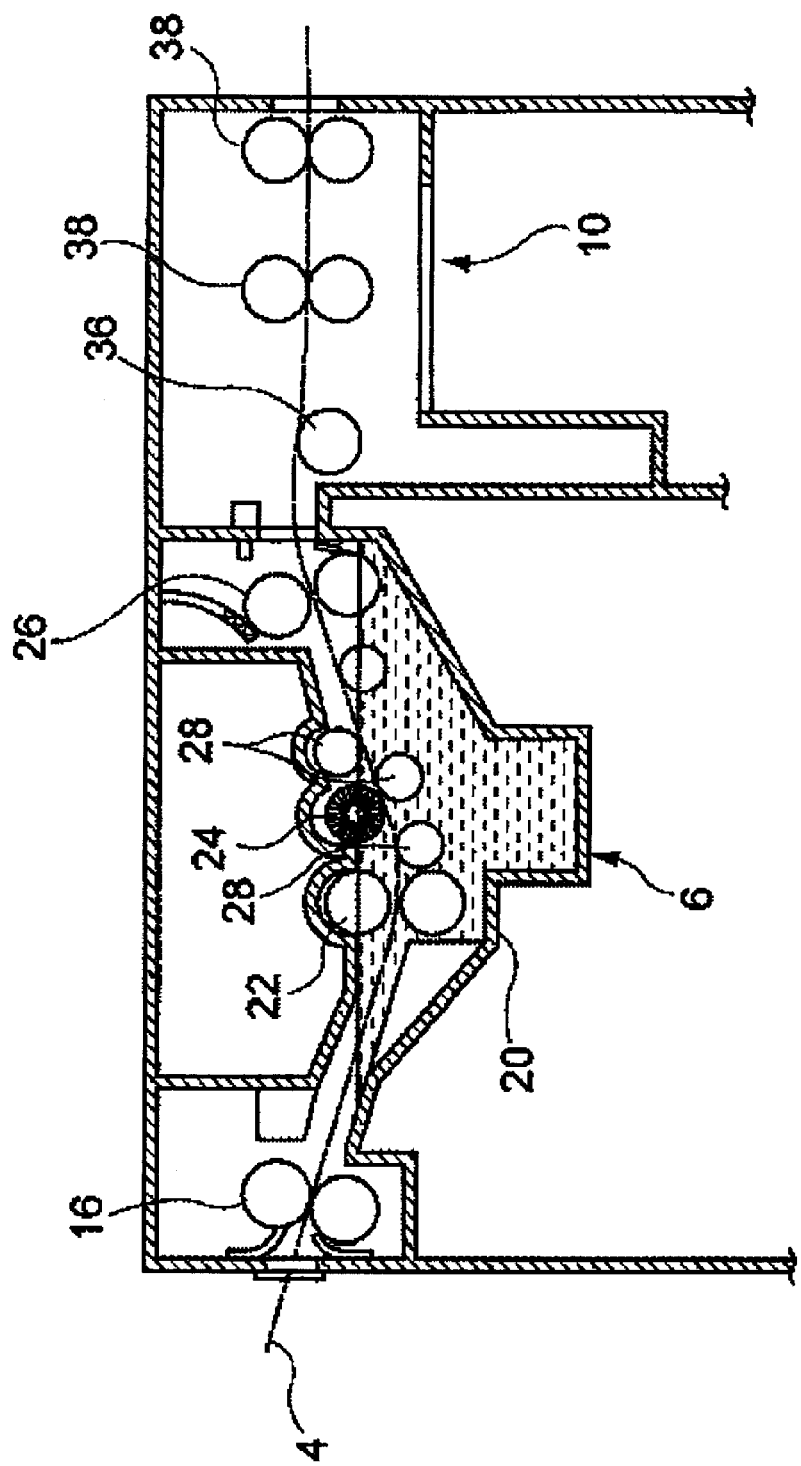

LITHOGRAPHIC PRINTING PLATE PRECURSOR AND METHOD OF PRODUCING THEREOF

TECHNICAL FIELD

The present invention relates to a lithographic printing plate precursor and a method of producing thereof. More particularly, it relates to a lithographic printing plate precursor of gum development type or on-press development type which is capable of undergoing a direct plate making by image exposure with laser, and a method of producing thereof.

BACKGROUND ART

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is heretofore used. Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a lith film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

In response to the environmental problem, simplification of development or plate making or non-processing has been pursued. As one method of simple plate making, a method referred to as an "on-press development" is practiced. Specifically, according to the method after exposure of a lithographic printing plate precursor, the lithographic printing plate precursor is mounted as it is on a printing machine without conducting conventional development and removal of the unnecessary area of image-recording layer is performed at an early stage of printing process.

Also, as a method of simple development, a method referred to as a "gum development" is practiced in which removal of an overcoat layer and the unnecessary area of image-recording layer and protection of a hydrophilic surface revealed by the removal are performed at the same time and in which the removal of an overcoat layer and the unnecessary area of image-recording layer is performed in the same bath using not a conventional highly alkaline developer but a finisher or gum solution of near-neutral pH.

In the simplification of plate making operation as described above, a system using a lithographic printing plate precursor capable of being handled in a bright room or under a yellow lamp and a light source is preferred from the standpoint of workability. Thus, as the light source, a semiconductor laser emitting an infrared ray having a wavelength of 760 to 1,200 or a solid laser, for example, YAG laser, is used. An UV laser is also used.

As the lithographic printing plate precursor capable of undergoing on-press development, for instance, a lithographic printing plate precursor having provided on a hydrophilic support, an image-recording layer (heat-sensitive layer) containing microcapsules having a polymerizable compound encapsulated therein is described in Patent Documents 1 and 2. A lithographic printing plate precursor having provided on a support, an image-recording layer (photosensitive layer) containing an infrared absorbing agent, a radical polymerization initiator and a polymerizable compound is described in Patent Document 3. A lithographic printing plate precursor capable of undergoing on-press development having provided on a support, an image-recording layer containing a polymerizable compound and a graft polymer having a polyethylene oxide chain in its side chain or a block polymer having a polyethylene oxide block is described in Patent Document 4.

In case of using the polymerization reaction, it is known as a usual practice to provide an overcoat layer (also referred to as a protective layer) having an oxygen blocking property on the image-recording layer in order to prevent polymerization inhibition due to oxygen in the air and to increase sensitivity and printing durability. It is conventionally known that a water-soluble resin, for example, polyvinyl alcohol is used in the overcoat layer for the purpose described above. A lithographic printing plate precursor of on-press development type provided with an overcoat layer using a modified polyvinyl alcohol is described in Patent Document 5. Also, a lithographic printing plate precursor provided with an overcoat layer using an inorganic stratiform compound having an oxygen blocking property, for example, mica and a water-soluble resin is described in Patent Document 6.

However, in the on-press development system, when the overcoat layer mainly composed of polyvinyl alcohol as described in Patent Document 5 is used, there is a problem in that interfacial mixing partially arises at the coating and drying of the overcoat layer and a water-soluble resin is mixed into the image-recording layer. Due to the mixing of a water-soluble resin into the image-recording layer, the water-soluble resin remains on the surface of image-recording layer after the on-press development to cause a drawback of inferior ink receptivity at the printing after the on-press development.

Moreover, when the water-soluble resin even reaches an undercoat layer, polymerization arising from photopolymerization becomes insufficient to cause a drawback of insufficient printing durability.

In general, in the gum development in which an overcoat layer and the unexposed area of image-recording layer are removed at the same time with a gum solution of low pH, it takes a time for removing the overcoat layer to cause problems in that development removability of the unexposed area of image-recording layer is poor and in that since the component of overcoat layer once removed is difficult to be stably dispersed in the developer, the component of overcoat layer precipitates in the developing tank and in case of running processing (continuous development by an automatic development machine), the precipitate adheres on the lithographic printing plate precursor during processing as development scum to be liable to cause image defect.

PRIOR ART DOCUMENT

Patent Document

Patent Document 1: JP-A-2001-277740
Patent Document 2: JP-A-2001-277742
Patent Document 3: JP-A-2002-287334
Patent Document 4: U.S. Patent Publication No. 2003/0064318
Patent Document 5: JP-A-2005-271284
Patent Document 6: P-A-2005-119273

DISCLOSURE OF THE INVENTION

Problems that the Invention is to Solve

An object of the present invention is to provide a lithographic printing plate precursor in which the problems of development property in gum development and dispersion stability of protective component (development scum) removed by the development and a method of producing thereof, and a lithographic printing plate precursor of on-press development type which is excellent in all performances of on-press development property, ink receptivity, sensitivity and printing durability and a method of producing thereof.

Means for Solving the Problems (1) A lithographic printing plate precursor comprising a support, an image-recording layer containing a radical polymerization initiator and a radical polymerizable compound, and an overcoat layer containing a polymer resin which has a cloud point in an aqueous solution and includes a monomer unit containing at least any of an amino group and an amido bond, in this order.

(2) The lithographic printing plate precursor as described in (1) above, wherein the image-recording layer contains a sensitizing dye.

(3) The lithographic printing plate precursor as described in (2) above, wherein the sensitizing dye is an infrared absorbing dye.

(4) The lithographic printing plate precursor as described in (2) above, wherein the sensitizing dye is an ultraviolet absorbing dye.

(5) The lithographic printing plate precursor as described in (3) above, which comprises a support, an image-recording layer containing an infrared absorbing dye, a radical polymerization initiator and a radical polymerizable compound and being removable with at least any of printing ink and dampening water, and an overcoat layer containing a polymer resin which has a cloud point in an aqueous solution and includes a monomer unit containing at least any of an amino group and an amido bond, in this order.

(6) The lithographic printing plate precursor as described in any one of (1) to (6) above, wherein the monomer unit containing at least any of an amino group and an amido bond is represented by any of formulae (1) to (4) shown below.

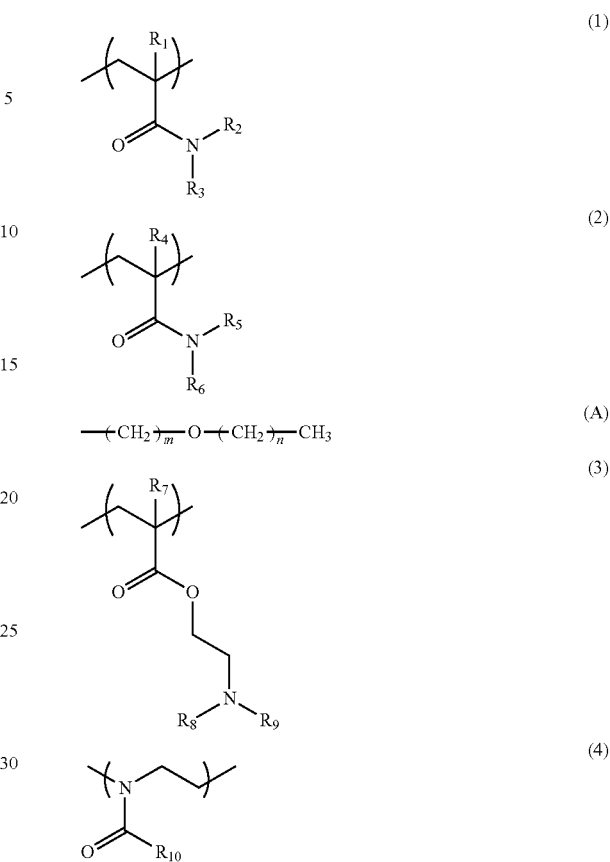

In formula (1), $R_1$ represents a hydrogen atom or a methyl group, and $R_2$ and $R_3$ each independently represents a hydrogen atom, a methyl group, an ethyl group, a n-propyl group, an isopropyl group, a n-butyl group, a sec-butyl group, an isobutyl group or a tert-butyl group, provided that at least one of $R_2$ and $R_3$ represents a methyl group, an ethyl group, a n-propyl group, an isopropyl group, a n-butyl group, a sec-butyl group, an isobutyl group or a tert-butyl group.

In formula (2), $R_4$ represents a hydrogen atom or a methyl group, $R_5$ and $R_6$ each independently represents a hydrogen atom or an alkoxyalkyl group represented by formula (A), m represents an integer from 1 to 3, n represents an integer from 1 to 3, and m+n is 2, 3 or 4, provided that at least one of $R_5$ and $R_6$ represents an alkoxyalkyl group represented by formula (A).

In formula (3), $R_7$ represents a hydrogen atom or a methyl group, and $R_8$ and $R_9$ each independently represents a hydrogen atom, a methyl group, an ethyl group, a n-propyl group or an isopropyl group, provided that at least one of $R_8$ and $R_9$ represents a methyl group, an ethyl group, a n-propyl group or an isopropyl group.

In formula (4), $R_{10}$ represents a methyl group, an ethyl group, a n-propyl group, an isopropyl group, a n-butyl group, a sec-butyl group, an isobutyl group or a tert-butyl group.

(7) The lithographic printing plate precursor as described in any one of (1) to (6) above, wherein the overcoat layer contains an inorganic stratiform compound.

(8) A method of producing a lithographic printing plate precursor as described in any one of (1) to (7) above comprising applying the image-recording layer containing a radical polymerization initiator and a radical polymerizable compound, and then applying the overcoat layer containing a polymer resin which has a cloud point in an aqueous solution and includes a monomer unit containing at least any of an amino group and an amido bond.

(9) The method of producing a lithographic printing plate precursor as described in (8) above, wherein drying temperature at the applying of an overcoat layer is not lower than the cloud point of the polymer resin.

According to the invention, gum development property, running processing property and scratch resistance can be improved in case of the gum development and ink receptivity and printing durability can be improved while maintaining on-press development property and sensitivity in case of the on-press development by means of using the polymer resin which has a cloud point in an aqueous solution and includes a monomer unit containing at least any of an amino group and an amido bond in the overcoat layer.

The functional mechanism thereof is not quite clear but it is believed as follows.

The polymer resin which has a cloud point in an aqueous solution and includes a monomer unit containing at least any of an amino group and an amido bond is stably dissolved in an aqueous solution at the preparation of a coating solution for overcoat layer, but since it is insolubilized in water not lower than the cloud point at the drying of the coating solution for overcoat layer, interfacial mixing into the image-recording layer can be inhibited to make it difficult to mix the water-soluble resin into the image-recording layer. Therefore, the overcoat layer is easily removed with dampening water at the on-press development and it is possible to reduce the residual amount of the water-soluble polymer resin in the surface of image-recording layer. Also, the polymer resin is easily soluble in an aqueous solution not higher than the cloud point and does not cause increase in viscosity. Thus, when the overcoat layer is dissolved at the gum development, dispersibility is excellent and viscosity of the aqueous solution in the developing bath does not increase so that the running processing property is also excellent. Further, since the amino group or amido bond interacts between the polymer resins at the coating and drying, the oxygen-blocking property is highly maintained and the layer per se is hard.

As a result, it is believed that the gum development property, running processing property and scratch resistance are excellent in case of the gum development and the ink receptivity and printing durability can be improved while maintaining the on-press development property and sensitivity in case of the on-press development.

Advantage of the Invention

According to the present invention, a lithographic printing plate precursor which is excellent in the gum development property, running processing property and scratch resistance and a lithographic printing plate precursor which is good in all performances of the on-press development property, ink receptivity, sensitivity and printing durability, and a method of producing thereof can be provided.

BRIEF DESCRIPTION OF THE DRAWING

FIG. 1 is a configuration view schematically showing an automatic development processor.

MODE FOR CARRYING OUT THE INVENTION

[Overcoat Layer]
[Polymer resin which has a cloud point in an aqueous solution and includes a monomer unit containing at least any of an amino group and an amido bond (hereinafter, referred to as a specific polymer resin)]

The specific polymer resin according to the invention is preferably a polymer resin having a cloud point in a range from 25 to 100° C. The specific polymer resin may be a homopolymer or may be a copolymer with other monomer. It is preferred to have a monomer unit represented by at least any of formulae (1) to (4) shown below.

(1)

In formula (1), $R_1$ represents a hydrogen atom or a methyl group, and $R_2$ and $R_3$ each independently represents a hydrogen atom, a methyl group, an ethyl group, a n-propyl group, an isopropyl group, a n-butyl group, a sec-butyl group, an isobutyl group or a tert-butyl group, provided that at least one of $R_2$ and $R_3$ represents a methyl group, an ethyl group, a n-propyl group, an isopropyl group, a n-butyl group, a sec-butyl group, an isobutyl group or a tert-butyl group.

Preferably, $R_2$ and $R_3$ each independently represents a hydrogen atom, an ethyl group, a n-propyl group or an isopropyl group, provided that at least one of $R_2$ and $R_3$ represents an ethyl group, a n-propyl group or an isopropyl group.

More preferably, $R_2$ and $R_3$ each independently represents a hydrogen atom or an isopropyl group, provided that at least one of $R_2$ and $R_3$ represents an isopropyl group.

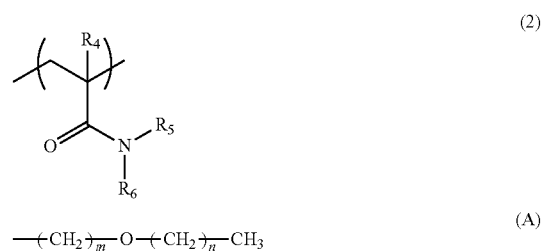

(2)

(A)

In formula (2), $R_4$ represents a hydrogen atom or a methyl group, $R_5$ and $R_6$ each independently represents a hydrogen atom or an alkoxyalkyl group represented by formula (A), provided that at least one of $R_5$ and $R_6$ represents an alkoxyalkyl group represented by formula (A), wherein m represents an integer from 1 to 3, n represents an integer from 1 to 3, and m +n is 2, 3 or 4.

Preferably, m +n is 2 or 3, more preferably m+n is 2.

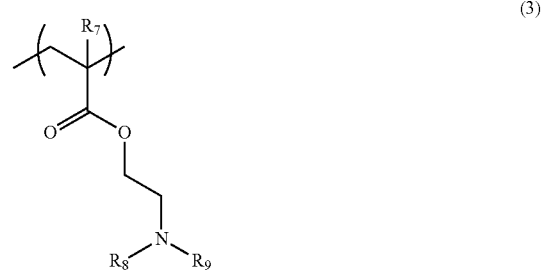

(3)

In formula (3), $R_7$ represents a hydrogen atom or a methyl group, and $R_8$ and $R_9$ each independently represents a hydrogen atom, a methyl group, an ethyl group, a n-propyl group or an isopropyl group, provided that at least one of $R_8$ and $R_9$ represents a methyl group, an ethyl group, a n-propyl group or an isopropyl group.

Preferably, $R_8$ and $R_9$ each independently represents a hydrogen atom, a methyl group or an ethyl group, provided that at least one of $R_8$ and $R_9$ represents a methyl group or an ethyl group. More preferably, $R_8$ and $R_9$ each independently represents a hydrogen atom or an ethyl group, provided that at least one of $R_8$ and $R_9$ represents an ethyl group.

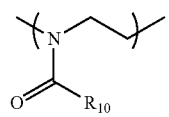

(4)

In formula (4), $R_{10}$ represents a methyl group, an ethyl group, a n-propyl group, an isopropyl group, a n-butyl group, a sec-butyl group, an isobutyl group or a tert-butyl group. Preferably, $R_{10}$ represents an ethyl group, a n-propyl group or an isopropyl group. More preferably, $R_{10}$ represents an isopropyl group.

The specific polymer resin according to the invention may include a copolymerizable other monomer unit other than the monomer unit containing at least any of an amino group and an amido bond according to the invention. As such other monomer unit, any copolymerizable monomer having an ethylenically unsaturated group is used without limitation. In particular, a monomer, for example, an acrylate or a methacrylate is exemplified. In case of the specific polymer resin including a copolymerizable monomer other than the monomer unit according to the invention, it is necessary that the monomer unit according to the invention is 50% or more in terms of molar ratio.

Examples of the copolymerizable monomer other than the monomer unit according to the invention include, an alkyl acrylate or alkyl methacrylate as typified by, for example, methyl acrylate, methyl methacrylate, ethyl acrylate, ethyl methacrylate, propyl acrylate, propyl methacrylate, butyl acrylate, butyl methacrylate, 2-ethylhexyl acrylate or 2-ethylhexyl methacrylate; a polyoxyalkylene methacrylate or polyoxyalkylene acrylate as typified by, for example, polyoxyethylene methacrylate or polyoxyethylene acrylate having a repeating unit number from 2 to 120, an amide monomer or monomer having an amino group, a polymer formed from which does not have a cloud point, for example, methacrylamide, acrylamide, 2-hydroxymethylacrylamide, 2-hydroxymethylmethacrylamide, 2-methacrylamidohistidine, N-vinylacetamide, N-methyl-N-vinylacetamide or N-acryloylaminoalkyl acid; and a vinyl monomer as typified by, for example, acrylonitrile, vinyl chloride or vinyl laurate.

The term "cloud point" as used herein means a value obtained according a measuring method described below.
[Measuring Method of Cloud Point]

Transmittance measurement was conducted using an absorption spectrometer, and temperature at which a solution began to become cloudy was determined due to change of temperature. In the measurement, an aqueous 2% by weight solution was used and the temperature was raised at a rate of 0.2° C./min A weight average molecular weight (Mw) of the specific polymer resin according to the invention is preferably in a range from 200 to 300,000, and more preferably in a range from 5,000 to 100,000. The Mw was determined according to a measuring method described below.
[Measuring Method of Mw]

The Mw of each polymer resin was determined as a weight average molecular weight (Mw) calculated in terms of polystyrene obtained by a gel permeation chromatography (GPC) method using N-methyl pyrrolidone (NMP) as an eluent and a monodisperse polystyrene as a standard.

Specific examples of the specific polymer resin including the monomer unit represented by formulae (1) to (4) are set forth below, but the invention should not be construed as being limited thereto.

Specific examples of the specific polymer resin including the monomer unit represented by formula (1) include [1] N-tert-butylacrylamide/N-methylacrylamide copolymer (for example, copolymerization ratio (molar ratio, hereinafter the same): 20/80, cloud point: 40° C.), [2] N-isopropylacrylamide/methacrylamide copolymer (for example, copolymerization ratio: 90/10, cloud point: 35° C.), [3] poly(N-ethylacrylamide) (cloud point: 82° C.), [4] poly(N-isopropylacrylamide) (cloud point: 32° C.) and [5] N-isopropylactylamide/N-isopropylmethacrylamide copolymer (copolymerization ratio: 70/30, cloud point: 38° C.), preferably [3] poly(N-ethylacrylamide), [4] poly(N-isopropylacrylamide) and [5] N-isopropylacrylamide/N-isopropylmethacrylamide copolymer (copolymerization ratio: 70/30), and more preferably [4] poly(N-isopropylacrylamide) and [5] N-isopropylacrylamide/N-isopropylmethacrylamide copolymer (copolymerization ratio: 70/30).

Specific examples of the specific polymer resin including the monomer unit represented by formula (2) include [6] poly(ethoxypropylacrylamide) (cloud point: 32° C.), [7] poly (N-(3-methoxypropyl)acrylamide) (cloud point: 60° C.) and [8] poly(N,N-bis(2-methoxyethyl)acrylamide) (cloud point: 49° C.), preferably [7] poly(N-(3-methoxypropyl)acrylamide and [8] poly(N,N-bis(2-methoxyethyl)acrylamide), and more preferably [8] poly(N,N-bis(2-methoxyethyl)acrylamide).

Specific examples of the specific polymer resin including the monomer unit represented by formula (3) include [9] poly(-propylamino)ethyl methacrylate (cloud point: 45° C.), [10] poly(2-dimethylamino)ethyl methacrylate (cloud point: 40° C.) and [11] poly(-diethylamino)ethyl methacrylate (cloud point: 50° C.), preferably [10] poly(-dimethylamino) ethyl methacrylate and [11] poly(2-diethylamino)ethyl methacrylate, and more preferably [11] poly(2-diethylamino)ethyl methacrylate.

Specific examples of the specific polymer resin including the monomer unit represented by formula (4) include [12] 2-methyl-2-oxazoline/2-n-butyl-2-oxazoline copolymer (for example, copolymerization ratio: 80/20, cloud point: 70° C.), [13] poly(-ethyl-2-oxazoline) (cloud point: 62° C.) and [14] poly(2-isopropyl-2-oxazoline) (cloud point: 36° C.), preferably [13] poly(2-ethyl-2-oxazoline) and [14] poly(2-isopropyl-2-oxazoline), and more preferably [14] poly(2-isopropyl-2-oxazoline).

TABLE 1

| Specific Examples of Specific Polymer Resin | | | |
|---|---|---|---|
| | Kind of Polymer | Cloud Point (° C.) | Mw |
| 1 | N-tert-Butylacrylamide/N-methylacrylamide copolymer (copolymerization ratio: 75/25) | 40 | 20,000 |

TABLE 1-continued

Specific Examples of Specific Polymer Resin

| | Kind of Polymer | Cloud Point (° C.) | Mw |
|---|---|---|---|
| 2 | N-isopropylacrylamide/methacrylamide copolymer (copolymerization ratio: 90/10) | 32-43 | 22,000 |
| 3 | Poly(N-ethylacrylamide) | 82 | 8,000 25,000 |
| 4 | Poly(N-isopropylacrylamide) | 32 | 200,000 25,000 |
| 5 | N-isopropylacrylamide/N-isopropyl-methacrylamide copolymer (copolymerization ratio: 70/30) | 34-45 | 27,000 |
| 6 | Poly(N-(3-ethoxypropyl)acrylamide) | 32 | 120,000 22,000 |
| 7 | Poly(N-(3-methoxypropyl)acrylamide | 60 | 10,000 20,000 |
| 8 | Poly(N,N-bis(2-methoxyethyl)acrylamide) | 49 | 50,000 30,000 |
| 9 | Poly(2-propylamino)ethyl methacrylate | 45 | 60,000 21,000 |
| 10 | Poly(2-dimethylamino)ethyl methacrylate | 40 | 60,000 20,000 |
| 11 | Poly(2-diethylamino)ethyl methacrylate | 50 | 120,000 27,000 |
| 12 | 2-Methyl-2-oxazoline/2-n-butyl-2-oxazoline copolymer (copolymerization ratio: 80/20) | 70 | 30,000 |
| 13 | Poly(2-ethyl-2-oxazoline) | 62 | 110,000 30,000 |
| 14 | Poly(2-isopropyl-2-oxazoline) | 36 | 80,000 30,000 |

The specific polymer resin is added to the overcoat layer preferably from 75 to 100% by weight, more preferably from 85 to 100% by weight, based on the total resin in the overcoat layer, from the standpoint of oxygen-blocking property.

[Other Water-soluble Resin]

Into the overcoat layer of the lithographic printing plate precursor according to the invention, a water-soluble resin other than the specific polymer resin may be incorporated. The other water-soluble resin is not particularly restricted as long as it is capable of forming a uniform layer which adheres to the image-recording layer.

Specifically, for example, a water-soluble polymer, for example, polyvinyl alcohol, a modified polyvinyl alcohol, polyvinyl pyrrolidone, polyvinyl imidazole, polyacrylic acid, polyacrylamide, a partially saponified product of polyvinyl acetate, an ethylene-vinyl alcohol copolymer, a water-soluble cellulose derivative, gelatin, a starch derivative or gum arabic is exemplified. The polymers may be used in combination of two or more kinds thereof, if desired.

Of the polymers, from the standpoint of easy removability of the overcoat layer remaining in the non-image area and handling property at the time of forming a layer, for example, polyvinyl alcohol, polyvinyl pyrrolidone, polyvinyl imidazole, a water-soluble acrylic resin, for example, polyacrylic acid, gelatin or gum arabic is preferred. Above all, polyvinyl alcohol, polyvinyl pyrrolidone, gelatin or gum arabic is more preferred from the standpoint of easiness of removal with dampening water at the printing.

The polyvinyl alcohol for use in the overcoat layer according to the invention may be partially substituted with an ester, an ether or an acetal as long as it contains a substantial amount of unsubstituted vinyl alcohol units necessary for maintaining water solubility. Also, the polyvinyl alcohol may partially contain other copolymerization components. Specific examples of the polyvinyl alcohol include those being hydrolyzed 71 to 100% by mole and having a polymerization degree in a range from 300 to 2,400.

Specifically, PVA-105, PVA-110, PVA-117, PVA-117H, PVA-12, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, produced by Kuraray Co., Ltd. are exemplified.

As the copolymer described above, polyvinyl acetate chloroacetate or propionate, polyvinyl formal and polyvinyl acetal and copolymers thereof each hydrolyzed from 88 to 100% by mole are exemplified.

The amount of the other water-soluble resin added is preferably 25% by weight or less, more preferably 10% by weight or less, based on the total solid content of the overcoat layer.

[Inorganic Stratiform Compound]

According to the invention, the overcoat layer may contain an inorganic stratiform compound together with the specific polymer resin. The inorganic stratiform compound is a particle having a thin tabular shape and includes, for instance, mica, for example, natural mica represented by the following formula: $A(B, C)_{2-5} D_4 O_{10} (OH, F, O)_2$, (wherein A represents any of K, Na and Ca, B and C each represents any of Fe(II), Fe(III), Mn, Al, Mg and V, and D represents Si or Al) or synthetic mica, talc represented by the following formula: $3MgO.4SiO_2.H_2O$, taeniolite, montmorillonite, saponite, hectorite and zirconium phosphate.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilicic mica $KMg_{2.5}(Si_4O_{10})F_2$, and swellable mica, for example, Na tetrasilicic mica $NaMg_{2.5}(Si_4O_{10})F_2$, Na or Li taeniolite $(Na, Li)Mg_2Li(Si_4O_{10})F_2$, or montmorillonite-based Na or Li hectorite $(Na, Li)_{1/8}Mg_{2/5}Li_{1/8}(Si_4O_{10})F_2$. Synthetic smectite is also useful.

In the invention, of the inorganic stratiform compounds, mica is preferred and fluorine-based swellable mica, which is a synthetic inorganic stratiform compound, is particularly useful. Specifically, the swellable synthetic mica and a swellable clay mineral, for example, montmorillonite, saponite, hectorite or bentonite have a laminate structure comprising a unit crystal lattice layer having thickness of approximately from 10 to 15 angstroms, and metallic atom substitution in the lattices thereof is remarkably large in comparison with other clay minerals. As a result, the lattice layer results in lack of positive charge and to compensate it, a cation, for example, $Li^+$, $Na^+$, $Ca^{2+}$ or $Mg^{2+}$ is adsorbed between the lattice layers. Particularly, in the case where the cation between the layers is $Li^+$ or $Na^+$, since the ionic radius is small, the bond between the stratiform crystal lattices is weak, thereby greatly swelling with water. When share is applied under such a condition, the stratiform crystal lattices are easily cleaved to form a stable sol in water. The bentonite and swellable synthetic mica strongly show this tendency and are useful in the invention and in particular, the swellable synthetic mica is preferably used.

As for the shape of the inorganic stratiform compound for use in the invention, from the standpoint of control of diffusion, the thickness is preferably smaller and as long as the smoothness of the coated surface and the transmission of actinic radiation are not damaged, the plane size is preferably larger. Therefore, an aspect ratio is preferably 20 or more, more preferably 100 or more, and particularly preferably 200 or more. The aspect ratio is a ratio of major axis to thickness of particle and can be determined, for example, from a projection drawing of particle by a microphotography. As the aspect ratio is larger, the effect obtained is higher.

As for a particle diameter of the inorganic stratiform compound for use in the invention, an average major axis is from 0.3 to 20 µm, preferably from 0.5 to 10 µm, and particularly preferably from 1 to 5 µm. Also, an average thickness of the particle is 0.1 µm or less, preferably 0.05 µm or less, and particularly preferably 0.01 µm or less. For example, with respect to the swellable synthetic mica that is the representative compound of the inorganic stratiform compound, the thickness is approximately from 1 to 50 nm and the plain size is approximately from 1 to 20 µm.

When such an inorganic stratiform compound particle having a large aspect ratio is incorporated into the overcoat layer, strength of the coated layer increases and penetration of oxygen or moisture can be effectively inhibited and thus, the overcoat layer can be prevented from deterioration due to deformation, and even when the lithographic printing plate precursor is preserved for a long period of time under a high humidity condition, deterioration of the image-forming property in the lithographic printing plate precursor due to the change of humidity is prevented and the excellent preservation stability is obtained.

The inorganic stratiform compound is added to a coating solution for overcoat layer as a dispersion prepared by dispersing it in water using a dispersing machine, for example, homogenizer. The content of the inorganic stratiform compound in the overcoat layer is preferably from 5/1 to 1/100 in terms of weight ratio to the amount of the specific polymer resin used in the overcoat layer. When a plurality of inorganic stratiform compounds is used in combination, it is also preferred that the total amount of the inorganic stratiform compounds fulfills the above-described weight ratio.

To the coating solution for overcoat layer can be added known additives, for example, an anionic surfactant, a non-ionic surfactant, a cationic surfactant or a fluorine-based surfactant for improving the coating property or a water-soluble plasticizer for improving the physical property of the overcoat layer. Examples of the water-soluble plasticizer include propionamide, cyclohexane diol, glycerin and sorbitol. Further, to the coating solution for overcoat layer may be added known additives for improving properties, for example, adhesion property to the image-recording layer, preservation stability of the coating solution and ink receptivity.

Ordinarily, the exposure is performed in the air according to the invention. The overcoat layer prevents a low molecular weight compound, for example, oxygen or a basic substance present in the air, which inhibits the image-forming reaction occurred upon the exposure in the image-recording layer from penetrating into the image-recording layer and as a result, the inhibition of image-forming reaction at the exposure in the air can be restrained. Accordingly, the characteristic required of the overcoat layer is to reduce permeability of the low molecular weight compound, for example, oxygen. Further, the overcoat layer preferably has good transparency to light used for the exposure, is excellent in an adhesion property to the image-recording layer, and can be easily removed during the on-press development processing step after the exposure. With respect to the overcoat layer having such properties, various investigations have been made heretofore and there are described in detail, for example, in U.S. Pat. No. 3,458,311 and JP-B-55-49729.

[Application of Overcoat Layer]

The overcoat layer is formed by coating a coating solution for overcoat layer prepared by dissolving the necessary components in a solvent on the image-recording layer provided on the support and drying. The coating solvent may be appropriately selected in view of solubility of the specific polymer resin, and purified water, for example, distilled water or ion-exchanged water is preferably used. A coating method of the overcoat layer is not particularly limited, and known methods, for example, methods described in U.S. Pat. No. 3,458,311 and JP-B-55-49729 can be utilized. Specifically, for example, a blade coating method, an air knife coating method, a gravure coating method, a roll coating method, a spray coating method, a dip coating method or a bar coating method is exemplified.

At the drying after coating the overcoat layer, it is preferred to conduct the drying at temperature higher than the cloud point. By the drying at temperature higher than the cloud point, the on-press development property, ink receptivity, sensitivity and printing durability are improved. Specifically, it is believed that the polymer resin which has a cloud point in an aqueous solution and includes a monomer unit containing at least any of an amino group and an amido bond deposits at temperature higher than the cloud point during the drying and interlayer mixing between the image-recording layer and the overcoat layer is inhibited.

The coating amount of the overcoat layer is preferably in a range from 0.01 to 10 g/m$^2$, more preferably in a range from 0.02 to 3 g/m$^2$, most preferably in a range from 0.02 to 1 g/m$^2$, in terms of coating amount after drying.

[Image-recording Layer]

The image-recording layer for use in the invention is an image-recording layer capable of undergoing on-press development. Also, the image-recording layer for use in the invention is an image-recording layer capable of undergoing gum development. As a representative image-forming embodiment included in the image-recording layer capable of undergoing on-press development or gum development, (1) an embodiment which contains (B) a radical polymerization initiator and (C) a radical polymerizable compound and in which the image area is cured utilizing a polymerization reaction, (2) an embodiment which contains (A) a sensitizing dye (particularly, a sensitizing dye having an absorption maximum in a wavelength range from 350 to 450 nm or an infrared absorbing dye having an absorption maximum in a wavelength range from 750 to 1,4000 nm), (B) a radical polymerization initiator and (C) a radical polymerizable compound and in which the image area is cured utilizing a polymerization reaction, and (3) an embodiment in which (E) a polymer fine particle is incorporated into the image-recording layer of polymerization type of (1) and (2) above and in which a hydrophobic region (image area) is formed utilizing a heat reaction of the polymer fine particle (such a polymer fine particle is also referred to as a hydrophobilizing precursor) are exemplified. Among them, an embodiment of the polymerization type which contains (A) an infrared absorbing dye, (B) a radical polymerization initiator and (C) a radical polymerizable compound is preferred.

Respective components which can be incorporated into the image-recording layer will be described in order below.

<Sensitizing Dye>

The image-recording layer may contain a sensitizing dye. The sensitizing dye can be used without particular limitation as far as it absorbs light at the image exposure to form the excited state and provides energy to a radical polymerization initiator described hereinafter with electron transfer, energy transfer or heat generation thereby improving the polymerization initiation function. Particularly, a sensitizing dye having an absorption maximum in a wavelength range from 350 to 450 nm or from 750 to 1,400 nm is preferably used.

Examples of the sensitizing dye having an absorption maximum in a wavelength range from 350 to 450 nm include merocyanine dyes, benzopyranes, coumarins, aromatic ketones and anthracenes.

Of the sensitizing dyes having an absorption maximum in a wavelength range from 350 to 450 nm, a dye represented by formula (I) shown below is more preferable in view of high sensitivity.

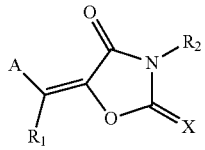

In formula (I), A represents an aromatic cyclic group which may have a substituent or a heterocyclic group which may have a substituent, X represents an oxygen atom, a sulfur atom or $N(R_3)$, and $R_1$, $R_2$ and $R_3$ each independently represents a hydrogen atom or a monovalent non-metallic atomic group, or A and $R_1$ or $R_2$ and $R_3$ may be combined with each other to form an aliphatic or aromatic ring.

The formula (I) will be described in more detail below. $R_1$, $R_2$ and $R_3$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Now, A in formula (I) is described below. A represents an aromatic cyclic group which may have a substituent or a heterocyclic group which may have a substituent. Specific examples of the aromatic cyclic group which may have a substituent and heterocyclic group which may have a substituent are same as those for the substituted or unsubstituted aryl group and substituted or unsubstituted aromatic heterocyclic residue described for any one of $R_1$, $R_2$ and $R_3$ in formula (I), respectively.

Specific examples of the sensitizing dye include compounds described in Paragraph Nos. [0047] to [0053] of JP-A-2007-58170.

Further, sensitizing dyes represented by formulae (II) or (III) shown below can also be used.

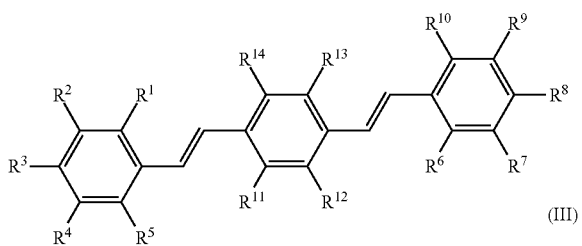

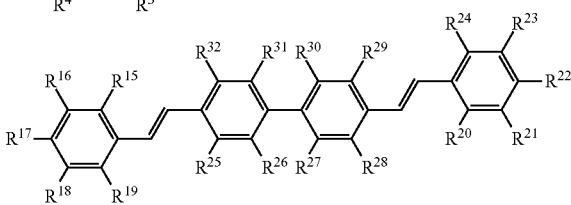

In formula (II), $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms.

In formula (III), $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

As specific examples of these sensitizing dyes, compounds described in EP-A-1349006 and WO 2005/029187 are preferably used.

Further, sensitizing dyes described in JP-A-2007-171406, JP-A-2007-206216, JP-A-2007-206217, JP-A-2007-225701, JP-A-2007-225702, JP-A-2007-316582 and JP-A-2007-328243 are also preferably used.

As the infrared absorbing dye, compounds described in Paragraph Nos. [0058] to [0087] of JP-A-2008-195018 can be used.

Of the dyes, a cyanine dye, a squarylium dye, a pyrylium dye and a nickel thiolate complexes are particularly preferred. As the particularly preferred example of the dye, a cyanine dye represented by formula (a) shown below is exemplified.

Formula (a)

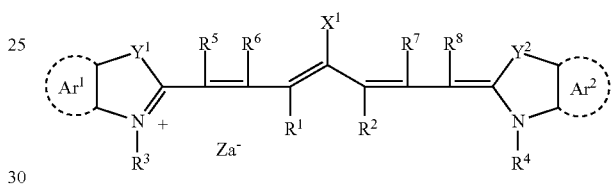

In formula (a), $X^1$ represents a hydrogen atom, a halogen atom, $-N(R^9)(R^{10})$, $X^2-L^1$ or a group shown below. $R^9$ and $R^{10}$, which may be the same or different, each represents an aromatic hydrocarbon group having from 6 to 10 carbon atoms, which may have a substituent, an alkyl group having from 1 to 8 carbon atoms, which may have a substituent or a hydrogen atom, or $R^9$ and $R^{10}$ may be combined with each other to form a ring. Among them, a phenyl group is preferred. $X^2$ represents an oxygen atom or a sulfur atom, $L^1$ represents a hydrocarbon group having from 1 to 12 carbon atoms, an aromatic ring group containing a hetero atom or a hydrocarbon group having from 1 to 12 carbon atoms and containing a hetero atom. The hetero atom as used herein indicates a nitrogen atom, a sulfur atom, an oxygen atom, a halogen atom or a selenium atom. In the group shown below, $Xa^-$ has the same meaning as $Za^-$ defined hereinafter, and $R^a$ represents a hydrogen atom or a substituent selected from an alkyl group, an aryl group, a substituted or unsubstituted amino group and a halogen atom.

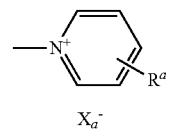

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. It is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferred examples of the aromatic hydrocarbon group include a benzene ring group and a naphthalene ring group. Also, preferred examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (a) has an anionic substituent in the structure thereof and neutralization of charge is not needed. In view of the preservation stability of a coating solution for image-recording layer, preferred examples of the counter ion for $Za^-$ include a halide ion, a perchlorate ion, a tetrafluoroborate ion, a hexafluorophosphate ion and a sulfonate ion, and particularly preferred examples thereof include a perchlorate ion, a hexafluorophosphate ion and an arylsulfonate ion.

Specific examples of the cyanine dye represented by formula (a), which can be preferably used in the invention, include those described in Paragraph Nos. [0017] to [0019] of JP-A-2001-133969, Paragraph Nos. [0012] to [0021] of JP-A-2002-23360 and Paragraph Nos. [0012] to [0037] of JP-A-2002-40638.

The infrared absorbing dyes (A) may be used only one kind or in combination of two or more kinds thereof and it may also be used together with an infrared absorbing agent other than the infrared absorbing dye, for example, a pigment. As the pigment, compounds described in Paragraph Nos. [0072] to [0076] of JP-A-2008-195018 are preferred.

The content of the infrared absorbing dye in the image-recording layer according to the invention is preferably from 0.1 to 10.0% by weight, more preferably from 0.5 to 5.0% by weight, based on the total solid content of the image-recording layer.

(B) Radical Polymerization Initiator

The radical polymerization initiator (B) for use in the invention indicates a compound which initiates or accelerates polymerization of a radical polymerizable compound (C). The radical polymerization initiator for use in the invention includes, for example, known thermal polymerization initiators, compounds containing a bond having small bond dissociation energy and photopolymerization initiators.

The radical polymerization initiator according to the invention include, for example, (a) an organic halide, (b) a carbonyl compound, (c) an azo compound, (d) an organic peroxide, (e) a metallocene compound, (f) an azide compound, (g) a hexaarylbiimidazole compound, (h) an organic borate compound, (i) a disulfone compound, (j) an oxime ester compound and (k) an onium salt compound.

As the organic halide (a), compounds described in Paragraph Nos. [0022] to [0023] of JP-A-2008-195018 are preferred.

As the carbonyl compound (b), compounds described in Paragraph No. [0024] of JP-A-2008-195018 are preferred.

As the azo compound (c), for example, azo compounds described in JP-A-8-108621 are used.

As the organic peroxide (d), for example, compounds described in Paragraph No. [0025] of JP-A-2008-195018 are preferred.

As the metallocene compound (e), for example, compounds described in Paragraph No. of JP-A-2008-195018 are preferred.

As the azide compound (f), a compound, for example, 2,6-bis(4-azidobenzylidene)-4-methylcyclohexanone is exemplified.

As the hexaarylbiimidazole compound (g), for example, compounds described in Paragraph No. [0027] of JP-A-2008-195018 are preferred.

As the organic borate compound (h), for example, compounds described in Paragraph No. of JP-A-2008-195018 are preferred.

As the disulfone compound (i), for example, compounds described in JP-A-61-166544 and JP-A-2002-328465 are exemplified.

As the oxime ester compound (j), for example, compounds described in Paragraph Nos. [0028] to [0030] of JP-A-2008-195018 are preferred.

As the onium salt compound (k), onium salts, for example, diazonium salts described in S. I. Schlesinger, *Photogr. Sci. Eng.*, 18, 387 (1974) and T. S. Bal et al., *Polymer*, 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Patent Publication No. 2008/0311520, JP-A-2-150848 and JP-A-2008-195018, sulfonium salts described in European Patents 370,693, 390, 214, 233,567, 297,443 and 297,442, U.S. Pat. Nos. 4,933, 377, 4,760,013, 4,734,444 and 2,833,827 and German Patents 2,904,626, 3,604,580 and 3,604,581, selenonium salts described in J. V. Crivello et al., *Macromolecules*, 10 (6), 1307 (1977) and J. V. Crivello et al., *J. Polymer Sci., Polymer Chem. Ed.*, 17, 1047 (1979), arsonium salts described in C. S. Wen et al., *Teh. Proc. Conf. Rad. Curing ASIA*, p. 478, Tokyo, Oct. (1988), and azinium salts described in JP-A-2008-195018 are exemplified.

Of the radical polymerization initiators described above, the onium salt, in particular, the iodonium salt, the sulfonium salt or the azinium salt is more preferred. Specific examples of these compounds are set forth below, but the invention should not be construed as being limited thereto.

Of the iodonium salts, a diphenyliodonium salt is preferred. In particular, a diphenyliodonium salt substituted with an electron donating group, for example, an alkyl group or an alkoxy group is preferred, and an asymmetric diphenyliodonium salt is more preferred. Specific examples of the iodonium salt include diphenyliodonium hexafluorophosphate, 4-methoxyphenyl-4-(2-methylpropyl)phenyliodonium hexafluorophosphate, 4-(2-methylpropyl)phenyl-p-tolyliodonium hexafluorophosphate, 4-hexyloxyphenyl-2,4,6-trimethoxyphenyliodonium hexafluorophosphate, 4-hexyloxyphenyl-2,4-diethoxyphenyliodonium tetrafluoroborate, 4-octyloxyphenyl-2,4,6-trimethoxyphenyliodonium 1-perfluorobutanesulfonate, 4-octyloxyphenyl-2,4,6-trimethoxyphenyliodonium hexafluorophosphate and bis(4-tert-butylphenyl)iodonium tetraphenylborate.

Examples of the sulfonium salt include triphenylsulfonium hexafluorophosphate, triphenylsulfonium benzoylformate, bis(4-chlorophenyl)phenylsulfonium benzoylformate, bis(4-chlorophenyl)-4-methylphenylsulfonium tetrafluoroborate and tris(4-chlorophenyl)sulfonium 3,5-bis(methoxycarbonyl)benzenesulfonate.

Examples of the azinium salt include 1-cyclohexylmethyloxypyridinium hexafluorophosphate, 1-cyclohexyloxy-4- phenylpyridinium hexafluorophosphate, 1-ethoxy-4-phenylpyridinium hexafluorophosphate, 1-(2-ethylhexyloxy)-4-phenylpyridinium hexafluorophosphate, 4-chloro-1-cyclohexylmethyloxypyridinium hexafluorophosphate, 1-ethoxy-4-cyanopyridinium hexafluorophosphate, 3,4-dichloro-1-(2-ethylhexyloxy)pyridinium hexafluorophosphate, 1-benzyloxy-4-phenylpyridinium hexafluorophosphate, 1-phenethyloxy-4-phenylpyridinium hexafluorophosphate, 1-(2-ethylhexyloxy)-4-phenylpyridinium p-toluenesulfonate, 1-(2-ethylhexyloxy)-4-phenylpyridinium perfluorobutanesulfonate, 1-(2-ethylhexyloxy)-4-phenylpyridinium bromide and 1-(2-ethylhexyloxy)-4-phenylpyridinium tetrafluoroborate.

The radical polymerization initiator can be added preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

(C) Radical Polymerizable Compound

The radical polymerizable compound (C) for use in the invention is an addition-polymerizable compound having at least one ethylenically unsaturated double bond, and it is preferably selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a mixture thereof, or a (co)polymer thereof.

Specific examples of the radical polymerizable compound include compounds described in Paragraph Nos. [0089] to [0098] of JP-A-2008-195018. Among them, esters of aliphatic polyhydric alcohol compound with an unsaturated carboxylic acid (for example, acrylic acid, methacrylic acid, itaconic acid, crotonic acid, isocrotonic acid or maleic acid) are preferably exemplified. Other preferred radical polymerizable compounds include polymerizable compounds containing an isocyanuric acid structure described in JP-A-2005-329708.

Of the compounds described above, isocyanuric acid ethylene oxide-modified acrylates, for example, tris(acryloyloxyethyl) isocyanurate or bis(acryloyloxyethyl)hydroxyethyl isocyanurate are particularly preferred, because they are excellent in balance between hydrophilicity relating to the on-press development property and polymerization ability relating to the printing durability.

In the invention, the radical polymerizable compound (C) is preferably used in an amount from 5 to 80% by weight, more preferably from 15 to 75% by weight, based on the total solid content of the image-recording layer.

(D) Binder Polymer

In the image-recording layer according to the invention, a binder polymer can be used for the purpose of improving film strength of the image-recording layer. The binder polymer which can be used in the invention can be selected from those heretofore known without restriction, and polymers having a film-forming property are preferred. Among them, an acrylic resin, a polyvinyl acetal resin or a polyurethane resin is preferred.

As the binder polymer preferred for the invention, a polymer having a crosslinkable functional group for improving film strength of the image area in its main chain or side chain, preferably in its side chain, as described in JP-A-2008-195018 is exemplified. Due to the crosslinkable functional group, crosslinkage is formed between the polymer molecules to facilitate curing.

As the crosslinkable functional group, an ethylenically unsaturated group, for example, a (meth)acryl group, a vinyl group or an allyl group or an epoxy group is preferred. The crosslinkable functional group can be introduced into the polymer by a polymer reaction or copolymerization. For instance, a reaction between an acrylic polymer or polyurethane having a carboxyl group in its side chain and glycidyl methacrylate or a reaction between a polymer having an epoxy group and a carboxylic acid containing an ethylenically unsaturated group, for example, methacrylic acid can be utilized.

The content of the crosslinkable group in the binder polymer is preferably from 0.1 to 10.0 mmol, more preferably from 1.0 to 7.0 mmol, most preferably from 2.0 to 5.5 mmol, based on 1 g of the binder polymer.

It is also preferred that the binder polymer for use in the invention further contains a hydrophilic group. The hydrophilic group contributes to impart the on-press development property to the image-recording layer. In particular, coexistence of the crosslinkable group and the hydrophilic group makes it possible to maintain compatibility between the printing durability and development property.

The hydrophilic group includes, for example, a hydroxy group, a carboxyl group, an alkylene oxide structure, an amino group, an ammonium group, an amido bond, a sulfo group and a phosphoric acid group. Among them, an alkylene oxide structure containing from 1 to 9 alkylene oxide units having 2 or 3 carbon atoms is preferred. In particular, a polyethylene oxide structure containing from 2 to 8 ethylene oxide units is preferred. This improves ink receptivity. In order to introduce a hydrophilic group into the binder polymer, a monomer having the hydrophilic group is copolymerized.

In order to control the ink receptivity, an oleophilic group, for example, an alkyl group, an aryl group, an aralkyl group or an alkenyl group may be introduced into the binder polymer according to the invention. Specifically, an oleophilic group-containing monomer, for example, an alkyl methacrylate is copolymerized.

Specific examples (1) to (11) of the binder polymer for use in the invention are set forth below, but the invention should not be construed as being limited thereto. The ratio of the repeating units is indicated as a molar ratio.

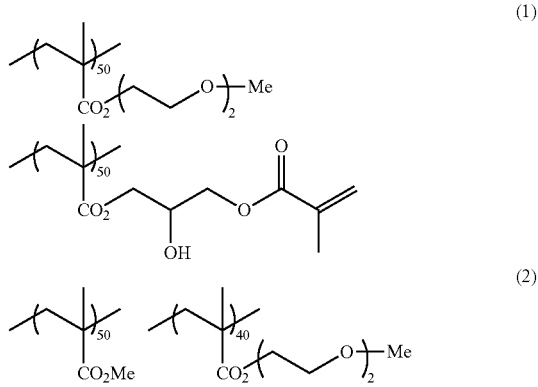

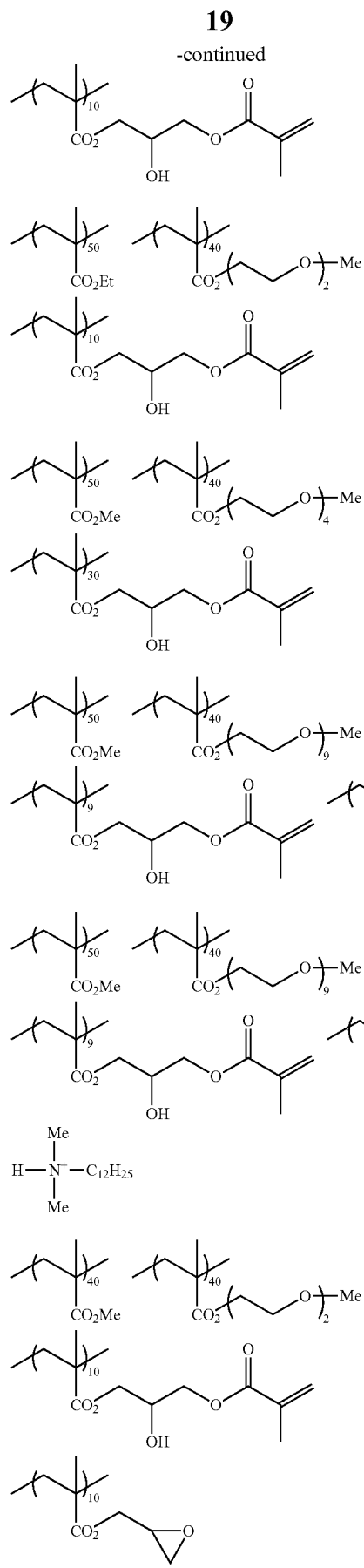
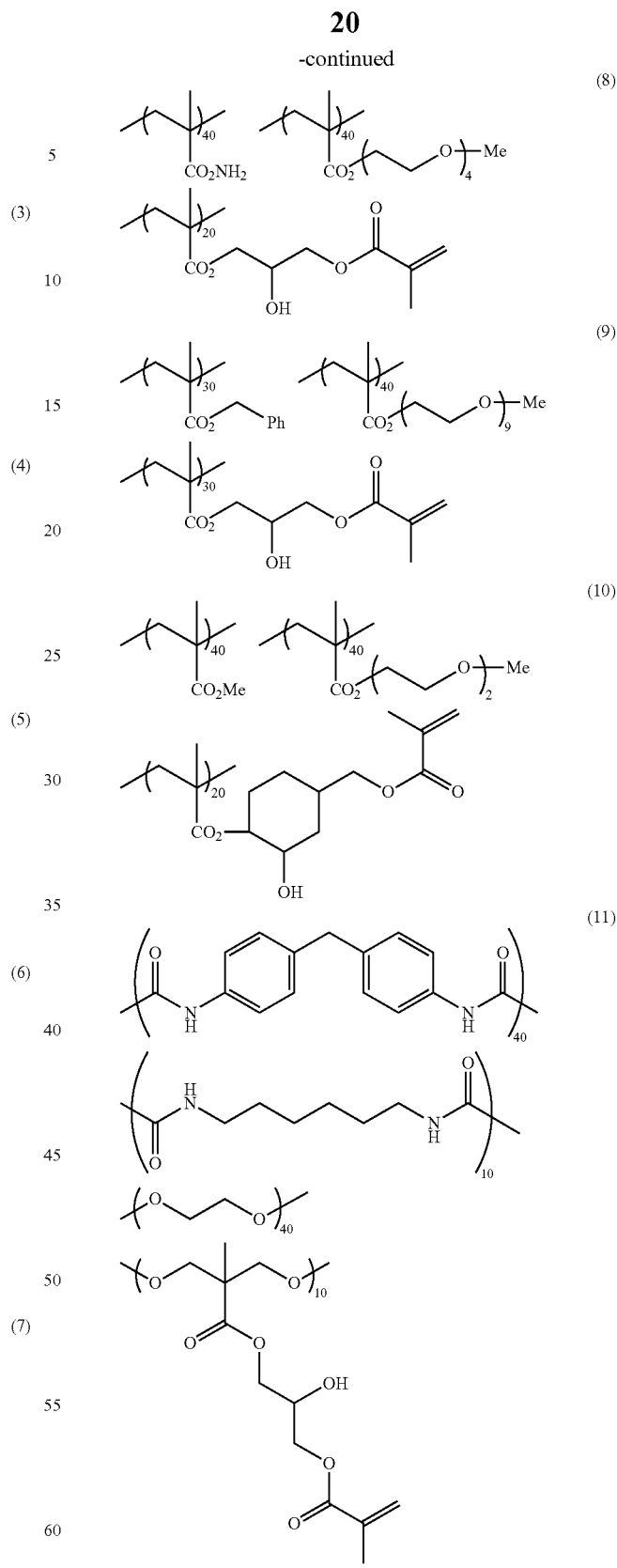
The weight average molecular weight (Mw) of the binder polymer according to the invention is preferably 2,000 or more, more preferably 5,000 or more, and still more preferably from 10,000 to 300,000.

According to the invention, a hydrophilic polymer, for example, polyacrylic acid or polyvinyl alcohol described in JP-A-2008-195018 may be used, if desired. Further, an oleophilic binder polymer is used together with a hydrophilic binder polymer.

The content of the binder polymer is ordinarily from 5 to 90% by weight, preferably from 5 to 80% by weight, more preferably from 10 to 70% by weight, based on the total solid content of the image-recording layer.

(E) Polymer Fine Particle

According to the invention, a polymer fine particle can be used in order to improve the on-press development property. In particular, a polymer fine particle having a polyalkylene oxide structure is preferred. Among them, a polymer fine particle having a polyalkylene oxide group in its side chain is preferred.

This increases permeability of dampening water to improve the on-press development property. As the polyalkylene oxide structure, an alkylene oxide structure containing from 2 to 120 alkylene oxide units having from 2 to 3 carbon atoms is preferred, and a polyethylene oxide structure containing from 2 to 120 ethylene oxide units is more preferred. Particularly, a polyethylene oxide structure containing from 20 to 100 ethylene oxide units is preferred. By means of such a polymer fine particle containing a polyalkylene oxide structure, compatibility between the printing durability and on-press development property can be achieved. Also, the ink receptivity can be improved.

The polymer fine particle according to the invention is preferably a hydrophobilizing precursor capable of converting the image-recording layer to be hydrophobic when heat is applied. The hydrophobilizing precursor polymer fine particle is preferably at least one fine particle selected from a hydrophobic thermoplastic polymer fine particle, a thermo-reactive polymer fine particle, a microcapsule having a hydrophobic compound encapsulated and a microgel (crosslinked polymer fine particle). Among them, a polymer fine particle having a polymerizable group and a microgel are preferred. In order to improve the on-press development property, the polymer fine particle preferably contains a polyalkylene oxide structure as described above.

As the hydrophobic thermoplastic polymer fine particle, hydrophobic thermoplastic polymer fine particles described, for example, in *Research Disclosure*, No. 333003, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among them, polystyrene, a copolymer containing styrene and acrylonitrile or polymethyl methacrylate is more preferred.

The average particle size of the hydrophobic thermoplastic polymer fine particle for use in the invention is preferably from 0.01 to 2.0 μm.

The thermo-reactive polymer fine particle for use in the invention includes a polymer fine particle having a thermo-reactive group and forms a hydrophobilized region by crosslinkage due to thermal reaction and change in the functional group involved therein.

As the thermo-reactive group of the polymer fine particle having a thermo-reactive group for use in the invention, a functional group performing any reaction can be used as long as a chemical bond is formed. For instance, an ethylenically unsaturated group (for example, an acryloyl group, a methacryloyl group, a vinyl group or an allyl group) performing a radical polymerization reaction, a cationic polymerizable group (for example, a vinyl group or a vinyloxy group), an isocyanate group or a blocked form thereof, an epoxy group or a vinyloxy group performing an addition reaction and a functional group having an active hydrogen atom (for example, an amino group, a hydroxy group or a carboxyl group) as the reaction partner thereof, a carboxyl group performing a condensation reaction and a hydroxy group or an amino group as the reaction partner thereof, and an acid anhydride performing a ring opening addition reaction and an amino group or a hydroxy group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsule. It is a preferred embodiment of the image-recording layer containing microcapsule that hydrophobic constituting components are encapsulated in the microcapsule and hydrophilic constituting components are present outside the microcapsule.

The image-recording layer according to the invention may be an embodiment containing a crosslinked resin particle, that is, a microgel. The microgel can contain a part of the constituting components of the image-recording layer inside and/or on the surface thereof. Particularly, an embodiment of a reactive microgel containing the radical polymerizable compound (C) on the surface thereof is preferred in view of the image-forming sensitivity and printing durability.

As a method of microencapsulation or microgelation of the constituting components of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time-lapse stability can be achieved.

The content of the polymer fine particle is preferably in a range from 5 to 90% by weight based on the total solid content of the image-recording layer.

(F) Other Components

The image-recording layer according to the invention may further contain other components, if desired.

(1) Hydrophilic Low Molecular Weight Compound

The image-recording layer according to the invention may contain a hydrophilic low molecular weight compound in order to improve the on-press development property without accompanying the decrease in the printing durability.

The hydrophilic low molecular weight compound includes a water-soluble organic compound, for example, a glycol, e.g., ethylene glycol, diethylene glycol, triethylene glycol, propylene glycol, dipropylene glycol or tripropylene glycol, or an ether or ester derivative thereof, a polyhydroxy compound, e.g., glycerine, pentaerythritol or tris(2-hydroxyethyl) isocyanurate, an organic amine, e.g., triethanol amine, diethanol amine or monoethanol amine, or a salt thereof, an organic sulfonic acid, e.g., an alkyl sulfonic acid, toluene sulfonic acid or benzene sulfonic acid, or a salt thereof, an organic sulfamic acid, e.g., an alkyl sulfamic acid, or a salt thereof, an organic sulfuric acid, e.g., an alkyl sulfuric acid or an alkyl ether sulfuric acid, or a salt thereof, an organic phosphonic acid, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine.

According to the invention, it is preferred that at least one compound selected from a polyol, an organic sulfate, an organic sulfonate and a betaine is incorporated.

Specific examples of the organic sulfonate include an alkylsulfonate, for example, sodium n-butylsulfonate, sodium n-hexylsulfonate, sodium 2-ethylhexylsulfonate, sodium cyclohexylsulfonate or sodium n-octylsulfonate; an alkylsulfonate containing an ethylene oxide chain, for example, sodium 5,8,11-trioxapentadecane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetradecosane-1-sulfonate; and an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfonate, disodium 1,5-naphtyldisulfonate or trisodium 1,3,6-naphtyltrisulfonate. The salt may also be a potassium salt or a lithium salt.

The organic sulfate includes a sulfate of alkyl, alkenyl, alkynyl, aryl or heterocyclic monoether of polyethylene oxide. The number of ethylene oxide unit is preferably from 1 to 4. The salt is preferably a sodium salt, a potassium salt or a lithium salt.

As the betaine, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-porpanesulfonate and 3-(1-pyridinio)-1-porpanesulfonate.

Since the hydrophilic low molecular weight compound has a small structure of hydrophobic portion and almost no surface active function, degradations of the hydrophobicity and film strength in the image area due to penetration of dampening water into the exposed area (image area) of the image-recording layer are prevented and thus, the ink receptivity and printing durability of the image-recording layer can be preferably maintained.

The amount of the hydrophilic low molecular weight compound added to the image-recording layer is preferably from 0.5 to 20% by weight, more preferably from 1 to 10% by weight, still more preferably from 2 to 10% by weight, based on the total solid content of the image-recording layer. In the range described above, good on-press development property and good printing durability are achieved.

The hydrophilic low molecular weight compounds may be used individually or as a mixture of two or more thereof.

(2) Oil-sensitizing Agent

In order to improve the ink receptivity, an oil-sensitizing agent, for example, a phosphonium compound, a nitrogen-containing low molecular weight compound or an ammonium group-containing polymer can be used in the image-recording layer. In particular, in the case where an inorganic stratiform compound is incorporated into an overcoat layer, the oil-sensitizing agent functions as a surface covering agent of the inorganic stratiform compound and prevents deterioration of the ink receptivity during printing due to the inorganic stratiform compound.

As preferred examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(triphenylphosphonio)butane di(hexafluorophosphate), 1,7-bis(triphenylphosphonio) heptane sulfate and 1,9-bis(tiphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetramethylammonium hexafluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate and benzyldimethyldodecylammonium hexafluorophosphate.

The ammonium group-containing polymer may be any polymer containing an ammonium group in its structure and is preferably a polymer containing from 5 to 80% by mole of (meth)acrylate having an ammonium group in its side chain as a copolymerization component.

As to the ammonium salt-containing polymer, its reduced specific viscosity value (unit: cSt/g/ml) determined according to the measuring method described below is preferably from 5 to 120, more preferably from 10 to 110, particularly preferably from 15 to 100.

<Measuring Method of Reduced Specific Viscosity>

In a 20 ml measuring flask was weighed 3.33 g of a 30% polymer solution (1 g as a solid content) and the measuring flask was filled up to the gauge line with N-methyl pyrrolidone. The resulting solution was put into an Ubbelohde viscometer (viscometer constant: 0.010 cSt/s) and a period for running down of the solution at 30° C. was measured. The viscosity was determined in a conventional manner according to the following calculating formula:

$$\text{Kinetic viscosity} = \text{Viscometer constant} \times \text{Period for liquid to pass through a capillary (sec)}$$

Specific examples of the ammonium group-containing polymer are set forth below.

(1) 2-(Trimethylammonio)ethyl methacrylate p-toluenesulfonate/3,6-dioxaheptyl methacrylate copolymer (molar ratio: 10/90)
(2) 2-(Trimethylammonio)ethyl methacrylate hexafluorophosphate/3,6-dioxaheptyl methacrylate copolymer (molar ratio: 20/80)
(3) 2-(Ethyldimethylammonio)ethyl methacrylate p-toluenesulfonate/hexyl methacrylate copolymer (molar ratio: 30/70)
(4) 2-(Trimethylammonio)ethyl methacrylate hexafluorophosphate/2-ethylhexyl methacrylate copolymer (molar ratio: 20/80)
(5) 2-(Trimethylammonio)ethyl methacrylate methylsulfate/hexyl methacrylate copolymer (molar ratio: 40/60)
(6) 2-(Butyldimethylammonio)ethyl methacrylate hexafluorophosphate/3,6-dioxaheptyl methacrylate copolymer (molar ratio: 20/80)
(7) 2-(Butyldimethylammonio)ethyl acrylate hexafluorophosphate/3,6-dioxaheptyl methacrylate copolymer (molar ratio: 20/80)

(8) 2-(Butyldimethylammonio)ethyl methacrylate 13-ethyl-5,8,11-trioxa-1-heptadecanesulfonate/3,6-dioxaheptyl methacrylate copolymer (molar ratio: 20/80)

(9) 2-(Butyldimethylammonio)ethyl methacrylate hexafluorophosphate/3,6-dioxaheptyl methacrylate/2-hydroxy-3-methacryloyloxypropyl methacrylate copolymer (molar ratio: 15/80/5)

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(3) Other Components

Other components, for example, a surfactant, a coloring agent, a print-out agent, a polymerization inhibitor, a higher fatty acid derivative, a plasticizer, a fine inorganic particle, an inorganic stratiform compound, a co-sensitizer or a chain transfer agent may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. [0060] of U.S. Patent Publication No. 2008/0311520 are preferably used.

(G) Formation of Image-recording Layer

The image-recording layer according to the invention is formed by dispersing or dissolving each of the necessary components described above in a known solvent to prepare a coating solution and coating the solution on a support by a known method, for example, bar coater coating and drying as described, for example, in Paragraph Nos. [0142] to [0143] of JP-A-2008-195018. The coating amount (solid content) of the image-recording layer formed on the support after coating and drying may be varied according to the intended purpose but is in general preferably from 0.3 to 3.0 g/m$^2$. In the range described above, good sensitivity and good film property of the image-recording layer can be achieved.

[Undercoat Layer]

In the lithographic printing plate precursor according to the invention, it is preferred to provide an undercoat layer (also referred to as an intermediate layer) between the image-recording layer and the support. The undercoat layer strengthens adhesion between the support and the image-recording layer in the exposed area and makes removal of the image-recording layer from the support in the unexposed area easy, thereby contributing improvement in the development property without accompanying degradation of the printing durability. Further, in the case of infrared laser exposure, since the undercoat layer acts as a heat insulating layer, decrease in sensitivity due to diffusion of heat generated upon the exposure into the support is prevented.

As a compound for use in the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified. A polymer resin having an adsorbing group capable of adsorbing to a surface of the support, a hydrophilic group and a crosslinkable group as described in JP-A-2005-125749 and JP-A-2006-188038 is more preferably exemplified. The polymer resin is preferably a copolymer of a monomer having an adsorbing group, a monomer having a hydrophilic group and a monomer having a crosslinkable group. More specifically, a polymer resin which is a copolymer of a monomer having an adsorbing group, for example, a phenolic hydroxy group, a carboxyl group, —PO$_3$H$_2$, —OPO$_3$H$_2$, —CONHSO$_2$—, —SO$_2$NHSO$_2$— and —COCH$_2$COCH$_3$, a monomer having a hydrophilic sulfo group and a monomer having a polymerizable crosslinkable group, for example, a methacryl group or an allyl group. The polymer resin may contain a crosslinkable group introduced by a salt formation between a polar substituent of the polymer resin and a compound containing a substituent having a counter charge to the polar substituent of the polymer resin and an ethylenically unsaturated bond and also may be further copolymerized with a monomer other than those described above, preferably a hydrophilic monomer.

The content of the unsaturated double bond in the polymer resin for undercoat layer is preferably from 0.1 to 10.0 mmol, most preferably from 2.0 to 5.5 mmol, based on 1 g of the polymer resin.

The weight average molecular weight of the polymer resin for undercoat layer is preferably 5,000 or more, more preferably from 10,000 to 300,000.

The undercoat layer according to the invention may contain a chelating agent, a secondary or tertiary amine, a polymerization inhibitor or a compound containing an amino group or a functional group having polymerization inhibition ability and a group capable of interacting with the surface of aluminum support (for example, 1,4-diazobicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the compounds for the undercoat layer described above in order to prevent the occurrence of stain due to the lapse of time.

The undercoat layer is coated according to a known method. The coating amount (solid content) of the undercoat layer is preferably from 0.1 to 100 mg/m$^2$, and more preferably from 1 to 30 mg/m$^2$.

[Support]

As the support for use in the lithographic printing plate precursor according to the invention, a known support is employed. Particularly, an aluminum plate subjected to roughening treatment and anodizing treatment according to a known method is preferred.

Also, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness of 0.10 to 1.2 μm.

The support may have a backcoat layer containing an organic polymer compound described in JP-A-5-45885 or an alkoxy compound of silicon described in JP-A-6-35174, provided on the back surface thereof, if desired.

[Plate Making Method]

The lithographic printing plate precursor according to the invention is subjected to plate making by development processing after image exposure. The development processing is preferably conducted by on-press development or development using a developer having pH from 2 to 11. The plate making method is described in more detail below.

<Image Exposure>

The lithographic printing plate precursor is, for example, exposed with laser through a transparent original having a line image, a halftone dot image or the like, or imagewise exposed by scanning of laser beam based on digital data.

The wavelength of the exposure light source preferably used is from 300 to 450 nm or from 750 to 1,400 nm. In case of using the exposure light source from 300 to 450 nm, the lithographic printing plate precursor having an image-recording layer containing a sensitizing dye having an absorption maximum in such a wavelength range is preferably used. In case of using the exposure light source from 750 to 1,400 nm, the lithographic printing plate precursor having an image-recording layer containing an infrared absorbing agent which is a sensitizing dye having an absorption maximum in such a wavelength range is preferably used. As the light source having a wavelength from 300 to 450 nm, a semiconductor laser is preferably used. As the light source having a wavelength from 750 to 1,400 nm, a solid laser or semiconductor laser emitting an infrared ray is preferably used. With respect to the infrared ray laser, the output is preferably 100 mW or more, the exposure time per pixel is preferably within 20 microseconds, and the irradiation energy is preferably from 10 to 300 mJ/cm$^2$. Further, in order to shorten the exposure time, it is preferred to use a multibeam laser device. The exposure mechanism may be any of an internal drum system, an external drum system and a flat bed system.

The image exposure can be performed in a conventional manner using, for example, a plate setter. In case of the on-press development, after the lithographic printing plate precursor is mounted on a printing machine, the image exposure may be performed on the printing machine. As the light source used for the image exposure in the invention, a laser is preferred. The laser for use in the invention is not particularly restricted and preferably includes, for example, a solid laser or semiconductor laser emitting an infrared ray having a wavelength from 760 to 1,200 nm.

With respect to the infrared ray laser, the output is preferably 100 mW or more, the exposure time per pixel is preferably within 20 microseconds, and the irradiation energy is preferably from 10 to 300 mJ/cm$^2$. With respect to the laser exposure, in order to shorten the exposure time, it is preferred to use a multibeam laser device.

<On-press Development Method>

In the on-press development method, the exposed lithographic printing plate precursor is mounted as it is on a printing machine without undergoing a development processing process. Then, the printing operation is initiated using the printing machine with supplying printing ink and dampening water and at an early stage of the printing the image-recording layer in the unexposed area is removed and the hydrophilic surface of support is revealed therewith to form the non-image area. In the exposed area of the image-recording layer, the image-recording layer cured by the exposure forms an ink receptive area having an oleophilic surface. As a result, the dampening water adheres onto the revealed hydrophilic surface and the printing ink adheres onto the exposed area of the image-recording layer, whereby printing is initiated.

While either the dampening water or printing ink may be supplied at first on the surface of lithographic printing plate precursor, it is preferred to supply the dampening water at first from the standpoint that the permeation of dampening water into the uncured image-recording layer is not inhibited by the printing ink.

Thus, the lithographic printing plate precursor according to the invention is subjected to the on-press development on an offset printing machine and used as it is for printing a large number of sheets.

<Development Using Developer Having pH From 2 to 11>

According to a conventional developing process using an alkali developer, an overcoat layer is removed in a pre-water washing step, the alkali development is conducted, the alkali is removed by washing with water in a post-water washing step, gum solution treatment is conducted and drying is conducted in a drying step. However, in the case where the lithographic printing plate precursor according to the invention is developed using a developer having pH from 2 to 11, the overcoat layer and the unexposed area of the image-recording layer are removed together and the resulting lithographic printing plate can be immediately mounted on a printing machine to perform printing. The developer having pH from 2 to 11 makes it possible to conduct the development and the gum solution treatment at the same time by incorporating a surfactant and/or a water-soluble polymer of oil-desensitizing property into the developer. Thus, the post-water washing step conducted after the alkali development is not particularly necessary and after conducting the development and gum solution treatment with one solution, the drying can be performed. It is preferred that after the development and gum treatment, the excess developer is removed using a squeeze roller, followed by conducting drying. Specifically, it is possible to perform a considerably simplified processing process (gum development) of development/gum treatment with one solution and drying.

The development according to the invention is performed in a conventional manner at temperature from 0 to 60° C., preferably from 15 to 40° C., using, for example, a method wherein the imagewise exposed lithographic printing plate precursor is immersed in the developer and rubbed with a brush or a method wherein the developer is sprayed to the imagewise exposed lithographic printing plate precursor and the lithographic printing plate precursor is rubbed with a brush.

The developer having pH from 2 to 11 is preferably an aqueous solution containing water as a main component (containing 60% by weight or more of water based on weight of the developer). In particular, an aqueous solution containing a surfactant (for example, an anionic, nonionic, cationic or amphoteric surfactant) or an aqueous solution containing a water-soluble polymer is preferred. An aqueous solution containing both the surfactant and the water-soluble polymer is also preferred. The pH of the developer is more preferably from 5 to 10.7, still more preferably from 6 to 10.5, and most preferably from 7.5 to 10.3.

The anionic surfactant for use in the developer is not particularly limited and includes fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di)sulfonic acid salts are particularly preferably used.

The cationic surfactant for use in the developer is not particularly limited, and conventionally known cationic surfactants can be used. Examples of the cationic surfactant include alkylamine salts, quaternary ammonium salts, alkylimidazolinium salts, polyoxyethylene alkyl amine salts and polyethylene polyamine derivatives.

The nonionic surfactant for use in the developer is not particularly limited and includes polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide addacts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol or sorbitan, fatty acid esters of sucrose, alkyl ethers of polyhydric alcohols and fatty acid amides of alkanolamines. Of the compounds, those having an aromatic ring and an ethylene oxide chain are preferred, and an alkyl-substituted or unsubstituted phenol ethylene oxide adduct and an alkyl-substituted or unsubstituted naphthol ethylene oxide adduct are more preferred.

The amphoteric surfactant for use in the developer is not particularly limited and includes an amine oxide type, for example, alkyldimethylamine oxide, a betaine type, for example, alkyl betaine and an amino acid type, for example, sodium salt of alkylamino fatty acid. In Particular, an alkyldimethylamine oxide which may have a substituent, an alkyl carboxy betaine which may have a substituent and an alkyl sulfo betaine which may have a substituent are preferably used. Specific examples of the compound are described, for example, in Paragraph Nos. [0255] to [0278] of JP-A-2008-203359 and Paragraph Nos. [0028] to [0052] of JP-A-2008-276166. Specific examples of the more preferred compound include 2-alkyl-N-carboxymethyl-N-hydroxyethyl imidazolinium betaine, alkyldiaminoethylglycine hydrochloride, lauryldimethylaminoacetic acid betaine, N-lauric acid amidopropyldimethyl betaine and N-lauric acid amidopropyldimethylamine oxide.

Two or more kinds of the surfactants may be used in combination. The rate of the surfactant contained in the developer is preferably from 0.01 to 20% by weight, and more preferably from 0.1 to 10% by weight.

The water-soluble polymer for use in the developer having pH from 2 to 11 includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, known soybean polysaccharide can be used. For example, as a commercial product, SOYAFIVE (trade name, produced by Fuji Oil Co., Ltd.) is available and various grade products can be used. The soybean polysaccharide preferably used is that having viscosity in a range from 10 to 100 mPa/sec in the 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more kinds of the water-soluble polymers may be used in combination. The content of the water-soluble polymer in the developer is preferably from 0.1 to 20% by weight, and more preferably from 0.5 to 10% by weight.

Into the developer having pH from 2 to 11 for use in the invention, a pH buffer agent may further be incorporated.

As the pH buffer agent, a pH buffer agent exhibiting a pH buffer function at pH from 2 to 11 is used without particular restriction. In the invention, a weak alkaline buffer agent is preferably used and includes, for example, (a) a carbonate ion and a hydrogen carbonate ion, (b) a borate ion, (c) a water-soluble amine compound and an ion of the water-soluble amine compound, and combinations thereof. Specifically, for example, (a) a combination of a carbonate ion and a hydrogen carbonate ion, (b) a borate ion, or (c) a combination of a water-soluble organic amine compound and an ion of the water-soluble amine compound exhibits a pH buffer function in the developer to prevent fluctuation of the pH even when the developer is used for a long period of time and as a result, for example, the deterioration of development property resulting from the fluctuation of pH and the occurrence of development scum are restrained. The combination of a carbonate ion and a hydrogen carbonate ion is particularly preferred.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferred. The alkali metals may be used individually or in combination of two or more thereof.

When the combination (a) of a carbonate ion and a hydrogen carbonate ion is adopted as the pH buffer agent, the total amount of the carbonate ion and hydrogen carbonate ion is preferably from 0.05 to 5 mole/l, more preferably from 0.1 to 2 mole/l, particularly preferably from 0.2 to 1 mole/l, based on the total weight of the developer.

The developer may contain an organic solvent. As the organic solvent capable of being contained, for example, an aliphatic hydrocarbon (e.g., hexane, heptane, Isopar E, Isopar H, Isopar G (produced by Esso Chemical Co., Ltd.)), an aromatic hydrocarbon (e.g., toluene or xylene), a halogenated hydrocarbon (methylene dichloride, ethylene dichloride, trichlene or monochlorobenzene) or a polar solvent is exemplified. Examples of the polar solvent include an alcohol (e.g., methanol, ethanol, propanol, isopropanol, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine, N-phenyldiethanolamine, N-methyldiethanolamine, N-ethyldiethanolamine, 4-(2-hydroxyethyl)morpholine, N,N-dimethylacetamide or N-methylpyrrolidone).

Two or more kinds of organic solvents may be used together in the developer.

Further, when the organic solvent is insoluble in water, it may be employed by being solubilized in water using a surfactant or the like. In the case where the developer contains an organic solvent, the concentration of the organic solvent is desirably less than 40% by weight in view of safety and inflammability.

The developer having pH from 2 to 11 may contain a preservative, a chelating agent, a defoaming agent, an organic acid, an inorganic acid, an inorganic salt or the like in addition the components described above. Specifically, compounds described in Paragraph Nos. [0266] to [0270] of JP-A-2007-206217 are preferably used.

The developer can be used as a developer and a development replenisher for the exposed lithographic printing plate precursor and it is preferably applied to an automatic processor described hereinafter. In the case of conducting the development processing using an automatic processor, the processing solution becomes fatigued in accordance with the processing amount, and hence the processing ability may be restored using a replenisher or a fresh developer.

The development processing using the developer having pH from 2 to 11 according to the invention is preferably performed by an automatic processor equipped with a supplying means for the developer and a rubbing member. An automatic processor using a rotating brush roll as the rubbing member is particularly preferred. Further, the automatic processor is preferably provided with a means for removing the excess developer, for example, a squeeze roller or a drying means, for example, a hot air apparatus, subsequently to the development processing means.

Further, in the plate making process of preparing a lithographic printing plate from the lithographic printing plate precursor according to the invention, the lithographic printing plate precursor may be heated its entire surface before or during the exposure or between the exposure and the development, if desired. By the heating, the image-forming reaction in the image-recording layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise, for example, in that the unexposed area is cured. On the other hand, the heating after the development can be performed using very strong conditions. Ordinarily, the heat treatment is carried out in a temperature range from 100 to 500° C. When the temperature is too low, a sufficient effect of strengthening the image may not be obtained, and whereas when it is excessively high, problems of deterioration of the support and thermal decomposition of the image area may occur.

EXAMPLE

The present invention will be described in detail with reference to the following examples, but the invention should not be construed as being limited thereto. With respect to polymer compound, unless otherwise specified, a molecular weight of the polymer compound means a weight average molecular weight (Mw) and a ratio of repeating units is indicated as a mole percent.

The specific polymer resins and comparative polymer resins used in the examples and comparative examples are shown below.

TABLE 2

Specific Polymer Resins Used in Examples

| No. | Kind of Polymer | Cloud Point (° C.) | Mw |
|---|---|---|---|
| P1 | N-tert-Butylacrylamide/N-methylacrylamide copolymer (copolymerization ratio: 75/25) | 40 | 20,000 |
| P2 | N-isopropylacrylamide/N-methacrylamide copolymer (copolymerization ratio: 90/10) | 32-43 | 22,000 |
| P3 | Poly(N-ethylacrylamide) | 82 | 25,000 |
| P4 | Poly(N-isopropylacrylamide) | 32 | 25,000 |
| P5 | N-isopropylacrylamide/N-isopropyl-methacrylamide copolymer (copolymerization ratio: 70/30) | 34-45 | 27,000 |
| P6 | Poly(N-(3-ethoxypropyl)acrylamide) | 32 | 22,000 |
| P7 | Poly(N-(3-methoxypropyl)acrylamide | 60 | 20,000 |
| P8 | Poly(N,N-bis(2-methoxyethyl)acrylamide) | 49 | 30,000 |
| P9 | Poly(2-propylamino)ethyl methacrylate | 45 | 21,000 |
| P10 | Poly(2-dimethylamino)ethyl methacrylate | 40 | 20,000 |
| P11 | Poly(2-diethylamino)ethyl methacrylate | 50 | 27,000 |
| P12 | 2-Methyl-2-oxazoline/2-n-butyl-2-oxazoline copolymer (copolymerization ratio: 80/20) | 70 | 30,000 |
| P13 | Poly(2-ethyl-2-oxazoline) | 62 | 30,000 |
| P14 | Poly(2-isopropyl-2-oxazoline) | 36 | 30,000 |

Comparative Polymer Resins used in Comparative Examples

(15) Polyvinyl alcohol (PVA-405, produced by Kuraray Co., Ltd.) (no cloud point)
(16) Polyacrylamide (produced by Sigma-Aldrich Co., Mw: 10,000, aqueous 50% by weight solution) (no cloud point)
(17) Hydroxypropyl cellulose (HPC-SSL, produced by Nippon Soda Co., Ltd., viscosity: 2.0 mPa·s (2% by weight), substitution degree: 1.9, cloud point: 42° C.)

Examples 1 to 25 and Comparative Examples 1 to 3

1. Preparation of Lithographic Printing Plate Precursors (1) to (20) and (R1) to (R3)
(1) Preparation of Support An aluminum plate (material: ES A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/cm$^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight nitric acid solution at 60° C. for 20 seconds, and washed with water. The etching amount of the grained surface was about 3 g/m$^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm² in terms of the peak value of the electric current, and 5% of the electric current flowing from the electric source was divided to the auxiliary anode. The quantity of electricity in the nitric acid electrolysis was 175 C/dm² in terms of the quantity of electricity when the aluminum plate functioned as an anode. The plate was then washed with water by spraying.

The plate was further subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm² in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm² to form a direct current anodized film of 2.5 g/m², washed with water and dried to prepare Support (1).

Thereafter, in order to ensure the hydrophilicity of the non-image area, Support (1) was subjected to silicate treatment using a 2.5% by weight aqueous sodium silicate No. 3 solution at 60° C. for 10 seconds and then was washed with water to obtain Support (2). The adhesion amount of Si was 10 mg/m². The center line average roughness (Ra) of the support was measured using a stylus having a diameter of 2 μm and found to be 0.51 μm.

(2) Formation of Undercoat Layer

Coating solution (1) for undercoat layer shown below was coated on Support (2) described above so as to have a dry coating amount of 20 mg/m² to prepare a support having an undercoat layer for using in the experiments described below.

<Coating Solution (1) for Undercoat Layer>

| Compound (1) for undercoat layer having structure shown below | 0.18 g |
|---|---|
| Hydroxyethyliminodiacetic acid | 0.10 g |
| Methanol | 55.24 g |
| Water | 6.15 g |

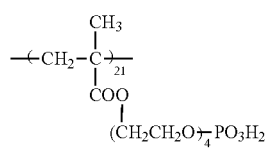

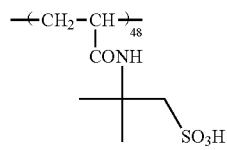

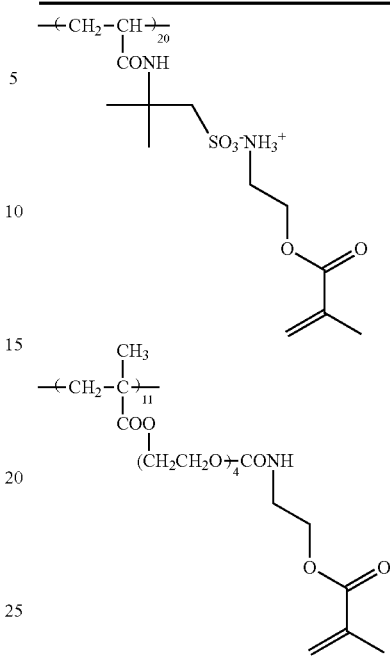

(Mw: 100,000)
Compound (1) for undercoat layer (3) Formation of Image-recording Layer Coating solution (1) for image-recording layer having the composition shown below was coated on the undercoat layer formed as described above by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

<Photosensitive Solution (1)>

| Binder polymer (1) having structure shown below | 0.240 g |
|---|---|
| Infrared absorbing dye (1) having structure shown below | 0.030 g |
| Radical polymerization initiator (1) having structure shown below | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium PF₆ salt | 0.018 g |
| Oil-sensitizing agent (Ammonium group-containing polymer having structure shown below (reduced specific viscosity: 44 ml/g) | 0.035 g |
| Fluorine-based surfactant (1) having structure shown below | 0.008 g |
| 2-Butanone | 1.091 g |
| 1-Methoxy-2-propanol | 8.609 g |

<Microgel Solution (1)>

| Microgel (1) shown below | 2.640 g |
|---|---|
| Distilled water | 2.425 g |

The structures of Binder polymer (1), Infrared absorbing dye (1), Radical polymerization initiator (1), Phosphonium compound (1), Hydrophilic low molecular weight compound (1), Ammonium group-containing polymer and Fluorine-based surfactant (1) are shown below.

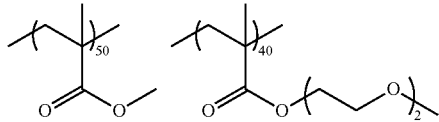

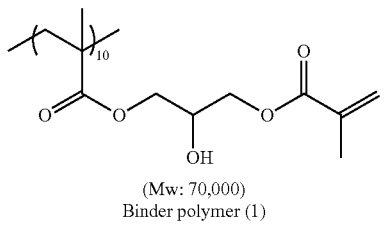

(Mw: 70,000)
Binder polymer (1)

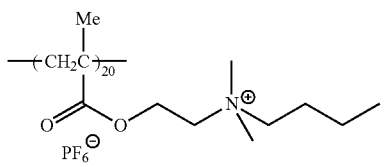

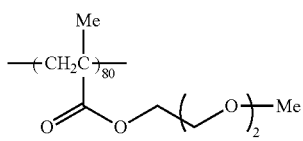

Ammonium group-containing polymer

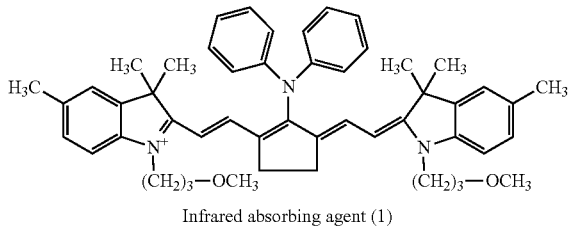

Infrared absorbing agent (1)

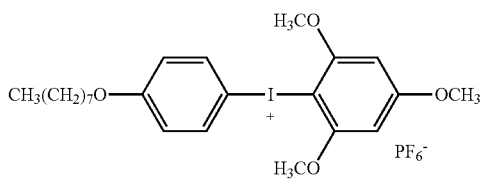

Radical polymerization initiator (1)

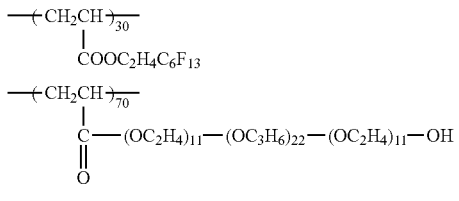

(Mw: 13,000)
Fluorine-based surfactant (1)

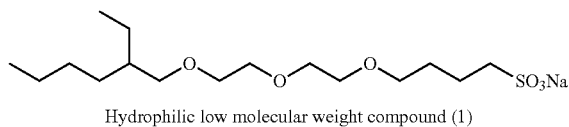

Hydrophilic low molecular weight compound (1)

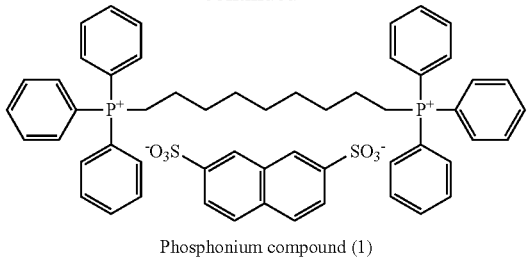

Phosphonium compound (1)

<Preparation of Microgel (1)>

An oil phase component was prepared by dissolving 4.46 g of polyfunctional isocyanate having the structure shown below (produced by Mitsui Chemicals Polyurethane, Inc., 75% ethyl acetate solution), 0.86 g of an adduct obtained by addition of trimethylolpropane (6 mol) and xylene diisocyanate (18 mol) and further addition of methyl-terminated polyoxyethylene (1 mol) (number of oxyethylene repeating unit: 90) (produced by Mitsui Chemicals Polyurethane, Inc., 50% ethyl acetate solution), 1.72 g of pentaerythritol tetraacrylate (SR399E, produced by Sartomer Co.) and 0.05 g of PIONIN A-41C (produced by Takemoto Oil & Fat Co., Ltd., 70% methanol solution) in 4.46 g of ethyl acetate. The oil phase component and 17.30 g of water as an aqueous phase component were mixed and emulsified using a homogenizer at 10,000 rpm for 15 minutes. The resulting emulsion was stirred at 40° C. for 4 hours. The microgel liquid thus-obtained was diluted using water so as to have the solid content concentration of 21.8% by weight. The average particle size of the microgel was 0.25 μm.

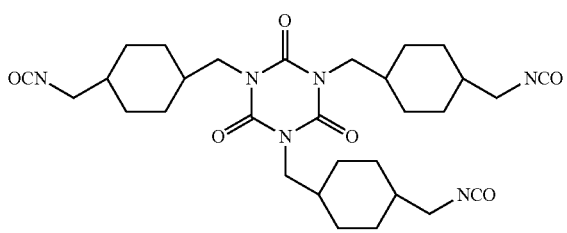

Polyfunctional isocyanate (4) Formation of Overcoat Layer (No. 1)

Coating solution (1) for overcoat layer having the composition shown below was coated on the image-recording layer described above by a bar and dried in an oven at 120° C. for 60 seconds to form an overcoat layer having a dry coating amount of 0.50 g/m², thereby preparing Lithographic printing plate precursors (1) to (15) for Examples 1 to 15 and Lithographic printing plate precursors (R1) to (R3) for Comparative Examples 1 to 3, respectively. In case of Lithographic printing plate precursor (15), a coating solution prepared by further adding 0.07 g of polyvinyl alcohol (PVA-405, produced by Kuraray Co., Ltd.) as other polymer resin to Coating solution (1) for overcoat layer was used.

<Coating Solution (1) for Overcoat Layer>

| | |
|---|---|
| Specific polymer resin shown in Table 2 (aqueous 6% by weight solution) | 0.63 g |
| Aqueous 1% by weight solution of surfactant (EMALEX 710, produced by Nihon Emulsion Co., Ltd.) | 0.86 g |
| Ion-exchanged water | 7.45 g |

(5) Formation of Overcoat Layer (No. 2)

Coating solution (2) for overcoat layer having the composition shown below was coated on the image-recording layer described above by a bar and dried in an oven at 120° C. for 60 seconds to form an overcoat layer having a dry coating amount of 0.15 g/m², thereby preparing Lithographic printing plate precursors (16) to (20) for Examples 16 to 20, respectively.

<Coating Solution (2) for Overcoat Layer>

| | |
|---|---|
| Dispersion (1) of inorganic stratiform compound shown below | 1.5 g |
| Specific polymer resin shown in Table 2 (aqueous 6% by weight solution) | 0.58 g |
| Aqueous 1% by weight solution of surfactant (EMALEX 710, produced by Nihon Emulsion Co., Ltd.) | 0.86 g |
| Ion-exchanged water | 6.0 g |

<Preparation of Dispersion (1) of Inorganic Stratiform Compound>

To 193.6 g of ion-exchanged water was added 6.4 g of synthetic mica (SOMASIF ME-100, produced by CO-OP Chemical Co., Ltd.) and the mixture was dispersed using a homogenizer until an average particle size (according to a laser scattering method) became 3 um. The aspect ratio of the inorganic particle thus-dispersed was 100 or more.

2. Preparation of Lithographic Printing Plate Precursors (21) to (25)

Coating solution (2) for image-recording layer shown below was coated on the support having the undercoat layer described above by a bar and dried in an oven at 70° C. for 60 seconds to form an image-recording layer having a dry coating amount of 0.6 g/m².

Coating solution (1) for overcoat layer shown above was further coated on the image-recording layer described above by a bar and dried in an oven at 120° C. for 60 seconds to form an overcoat layer having a dry coating amount of 0.15 g/m², thereby preparing Lithographic printing plate precursors (21) to (25) for Examples 21 to 25, respectively. In case of Lithographic printing plate precursor (25), the coating solution for overcoat layer used in Lithographic printing plate precursor (15) was used.

<Coating Solution (2) for Image-recording Layer>

| | |
|---|---|
| Aqueous dispersion (1) of polymer fine particle | 20.0 g |
| Infrared absorbing dye (2) having structure shown below | 0.2 g |
| Specialty | 0.5 g |
| Radical polymerizable compound (SR-399, produced by Sartomer Co.) | 1.50 g |
| Mercapto-3-triazole | 0.2 g |
| BYK 336 (produced by BYK-Chimie GmbH) | 0.4 g |
| KLUCEL M (produced by Hercules Chemical Co., Inc.) | 4.8 g |
| ELVACITE 4026 (produced by Ineos Acrylica Inc.) | 2.5 g |
| n-Propanol | 55.0 g |
| 2-Butanone | 17.0 g |

The compounds indicated using their trade names in the composition above are shown below.

IRGACURE 250: (4-Methoxyphenyl)[4-(2-methylpropyl)phenyl]iodonium hexafluorophosphate (75% by weight propylene carbonate solution)

SR-399: Dipentaerythritol pentaacrylate

BYK 336: Modified dimethylpolysiloxane copolymer (25% by weight xylene/methoxypropyl acetate solution)

KLUCEL M: Hydroxypropyl cellulose (2% by weight aqueous solution)

ELVACITE 4026: Highly branched polymethyl methacrylate (10% by weight 2-butanone solution)

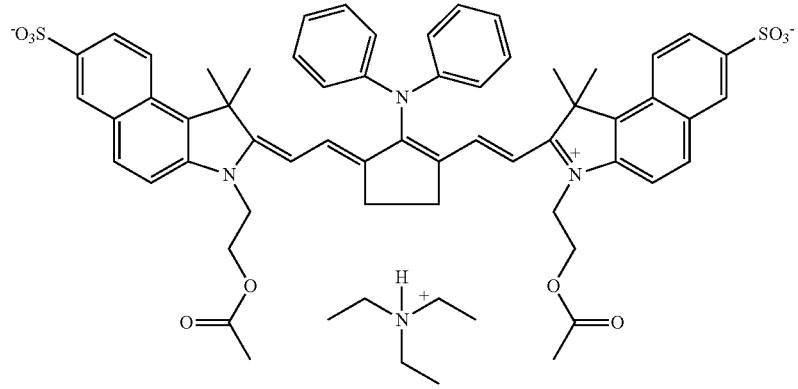

Infrared absorbing dye (2)

(Preparation of Aqueous Dispersion (1) of Polymer Fine Particle)

A stirrer, a thermometer, a dropping funnel, a nitrogen inlet tube and a reflux condenser were attached to a 1,000 ml four-neck flask and while carrying out deoxygenation by introduction of nitrogen gas, 10 g of polyethylene glycol methyl ether methacrylate (PEGMA, average repeating unit number of ethylene glycol: 50), 200 g of distilled water and 200 g of n-propanol were charged therein and heated until the internal temperature reached 70° C. Then, a mixture of 10 g of styrene (St), 80 g of acrylonitrile (AN) and 0.8 g of 2,2'-azobisisobutyronitrile previously prepared was dropwise added to the flask over a period of one hour. After the completion of the dropwise addition, the mixture was continued to react as it was for 5 hours. Then, 0.4 g of 2,2'-azobisisobutyronitrile was added and the internal temperature was raised to 80° C. Thereafter, 0.5 g of 2,2'-azobisisobutyronitrile was added over a period of 6 hours. At the stage after reacting for 20 hours in total, the polymerization proceeded 98% or more to obtain Aqueous dispersion (1) of polymer fine particle of PEGMA/St/AN (10/10/80 in a weight ratio). The particle size distribution of the polymer fine particle had the maximum value at the particle size of 150 nm.

The particle size distribution was determined by taking an electron microphotograph of the polymer fine particle, measuring particle sizes of 5,000 fine particles in total on the photograph, and dividing a range from the largest value of the particle size measured to 0 on a logarithmic scale into 50 parts to obtain occurrence frequency of each particle size by plotting. With respect to the aspherical particle, a particle size of a spherical particle having a particle area equivalent to the particle area of the aspherical particle on the photograph was defined as the particle size.

3. Evaluation of Specific Polymer Resin and Lithographic Printing Plate Precursor (1) Solution Stability of Aqueous Solution of Specific Polymer Resin An aqueous 6% by weight solution of the specific polymer resin was allowed to stand at 25° C. for one week and then the presence or absence of a precipitate on the bottom of the vessel was visually observed to evaluate solubility (solution stability) below the cloud point.

(2) Evaluation of Lithographic Printing Plate Precursor

<Case of Plate Making by On-Press Development>

The lithographic printing plate precursor obtained was exposed by LUXEL PLATESETTER T-6000III equipped with an infrared semiconductor laser (produced by FUJIFILM Corp.) under the conditions of a rotational number of an external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and FUSION-G (N) Black Ink (produced by Dainippon Ink & Chemicals, Inc.), the dampening water and ink were supplied according to the standard automatic printing start method of LITHRONE 26 to conduct printing on 100 sheets of TOKUBISHI art paper (76.5 kg) at a printing speed of 10,000 sheets per hour.

The on-press development property, ink receptivity and printing durability were evaluated in the manner shown below. The results obtained are shown in Table 4.

(1) On-press Development Property

A number of the printing papers required until the on-press development of the unexposed area of the image-recording layer on the printing machine was completed to reach a state where the ink was not transferred to the printing paper in the non-image area was measured to evaluate the on-press development property.

(2) Ink Receptivity

A number of the printing papers required until the ink density of the image area which was the exposed area reached a specified ink density was measured to evaluate the ink receptivity.

(3) Printing Durability

After performing the evaluation for the on-press development property described above, the printing was continued. As the increase in a number of printing papers, the image-recording layer was gradually abraded to cause decrease in the ink density on the printed material. A number of printing papers wherein a value obtained by measuring a halftone dot area rate of the 50% halftone dot of FM screen on the printed material using a Gretag densitometer decreased by 5% from the value measured on the 100th paper of the printing was determined to evaluate the printing durability.

<Case of Plate Making by Gum Development>

The exposed lithographic printing plate precursor described above was subjected to preheating at 100° C. for 30 seconds and then subjected to development processing in an automatic development processor having a structure as shown in FIG. 1 using Developer 1 having the composition shown below.

The automatic development processor comprises a developing unit 6 for developing a lithographic printing plate precursor (hereinafter, also referred to as a "PS plate") 4 and a drying unit 10 for drying the developed PS plate 4. An insertion slot is formed in a side plate of the automatic development processor (on the left side in FIG. 1) and the PS plate 4 inserted through the insertion slot is transported into the developing unit 6 by carrying-in rollers 16 provided inside the side plate of the automatic development processor. In a developing tank 20 of the developing unit 6, transport rollers 22, a brush roller 24 and squeeze rollers 26 are provided in order from the upstream side in the transporting direction and backup rollers 28 are disposed in appropriate positions therebetween. The PS plate 4 is immersed in the developer while being transported by the transport rollers 22 and the overcoat layer and the unexposed area of the image-recording layer of PS plate 4 are removed by rotation of the brush roller 24 to conduct development processing. The PS plate 4 subjected to the development processing is transported into the drying unit 10 by the squeeze rollers (carrying-out rollers) 26.

In the drying unit 10, a guide roller 36 and a pair of skewer rollers 38 are disposed in order from the upstream side in the transporting direction. In the drying unit 10, drying means, for example, hot air supply means or heat generating means (not shown) is also provided. A discharge slot is provided in the drying unit 10 and the PS plate 4 dried by the drying means is discharged through the discharge slot, whereby the processing of PS plate by the automatic development processor is completed. The automatic development processor used in the example had one brush roller having an outer diameter of 50 mm and being implanted with fiber of polybutylene terephthalate (bristle diameter: 200 μm, bristle length: 17 mm), and the brush roller was rotated at 200 rpm (peripheral velocity at the tip of brush: 0.52 m/sec) in the same direction as the transporting direction of the lithographic printing plate precursor. The temperature of the developer was 30° C. The transportation of the lithographic printing plate precursor was conducted at transporting speed of 100 cm/min. After the development processing, the lithographic printing plate was dried in the drying unit. The drying temperature was 80° C.

The compositions of Developer 1 used in the examples and comparative examples are shown in Table 3 below. In the developer, NEWCOL B13 is polyoxyethylene β-naphthyl ether (average number of oxyethylene: n=13, produced by Nippon Nyukazai Co., Ltd.) and gum arabic used has a weight average molecular weight (Mw) of 200,000.

TABLE 3

| Developer 1 (pH: 9.8) | |
|---|---|
| 0.2M Aqueous boric acid solution | 25.00 parts by weight |
| 0.2M Aqueous sodium chloride solution | 25.00 parts by weight |
| 0.1M Aqueous sodium hydroxide solution | 40.60 parts by weight |
| Water | 9.40 parts by weight |
| NEWCOL B13 (produced by Nippon Nyukazai Co., Ltd.) | 5.00 parts by weight |
| Gum arabic | 2.50 parts by weight |
| Hydroxy-alkylated starch (PENON JE66, produced by Nippon Starch Chemical Co., Ltd.) | 7.00 parts by weight |

The lithographic printing plate obtained was mounted on a printing machine (SOR-M, produced by Heidelberg) and printing was performed at a printing speed of 6,000 sheets per hour using dampening water (EU-3 (etching solution, produced by FUJIFILM Corp.))/water/isopropyl alcohol=1/89/

10 (by volume ratio)) and TRANS-G (N) Black Ink (produced by Dainippon Ink & Chemicals, Inc.).

The development property, running processing property, scratch resistance and scratch resistance were evaluated in the manner shown below. The results obtained are shown in Table 4.

(1) Development Property

The lithographic printing plate was subjected to the printing in the manner as described above, and on the 1,000th printed material, unevenness (unevenness of ink density) in the halftone dot image caused by stain in the non-image area was evaluated according to the criteria described below.

X: Case where the unevenness of ink density in the halftone dot image was observed.

Δ: Case where the unevenness of ink density in the halftone dot image was observed, but it was at an acceptable revel.

○: Case where the unevenness of ink density in the halftone dot image was slightly observed, but it was at a sufficiently acceptable revel.

○○: Case where the unevenness of ink density in the halftone dot image was not observed and good image was obtained.

The grade between ○○ and ○ was indicated as ○○~○.

(2) Running Processing Property

After the lithographic printing plate precursor was subjected to development processing in the manner as described above in an amount of 500 m², the occurrence of scum adhered on the tank wall of the automatic developing machine was visually observed. The scum occurred was mainly caused by the binder of the overcoat layer. The evaluation was conducted according to the criteria described below.

○: Case where the occurrence of scum was not observed.

Δ: Case where the occurrence of scum was at an acceptable level.

X: Case where the occurrence of scum was severe.

(3) Scratch Resistance

The surface of the lithographic printing plate precursor prepared was scratched using a scratch testing machine equipped with a sapphire needle having a radius of 4.0 mmΦ while applying the load of 200 g and then, the lithographic printing plate precursor was subjected to the exposure, development and printing in the manner described above and evaluated whether the normal printing image could be formed. When the strength of the overcoat layer is insufficient, the scratch occurs in the overcoat layer and the oxygen-blocking property becomes insufficient or the image-recording layer is also scratched together with the overcoat layer and the image-forming property is deteriorated in the scratched area. The evaluation was conducted according to the criteria described below.

○○: Case where the image formation was perfect.

○: Case where poor image formation was slightly partially recognized.

Δ: Case where the image formation was at an acceptable level.

X: Case where the image formation was poor.

The grade between ○○ and ○ was indicated as ○○~○.

TABLE 4

Examples 1 to 25 and Comparative Examples 1 to 3

| | | Overcoat Layer | | | Evaluation Results | | | | | | |
| | | | | | | Gum Development | | | On-press Development | | |
| | | | | | | Gum | | | Printing | | |
| Lithographic Printing Plate Precursor | Specific Polymer Resin | Inorganic Stratiform Compound | Other Resin | Solution Stability | Development Property | Running Processing Property | Scratch Resistance | On-press Development Property | Durability (×10⁴ sheets) | Ink Receptivity (sheets) |
|---|---|---|---|---|---|---|---|---|---|---|
| Example 1 | (1) | P1 | Absence | Absence | ○ | ○ | ○ | ○ | 20 | 4.5 | 15 |
| Example 2 | (2) | P2 | Absence | Absence | ○ | ○ | ○ | ○ | 20 | 4.5 | 15 |
| Example 3 | (3) | P3 | Absence | Absence | ○ | ○○~○ | ○ | ○ | 16 | 5.5 | 13 |
| Example 4 | (4) | P4 | Absence | Absence | ○ | ○○ | ○ | ○○ | 10 | 6.5 | 6 |
| Example 5 | (5) | P5 | Absence | Absence | ○ | ○○ | ○ | ○ | 12 | 6 | 8 |
| Example 6 | (6) | P6 | Absence | Absence | ○ | ○ | ○ | ○ | 25 | 5 | 20 |
| Example 7 | (7) | P7 | Absence | Absence | ○ | ○○~○ | ○ | ○ | 22 | 5.5 | 12 |
| Example 8 | (8) | P8 | Absence | Absence | ○ | ○○ | ○ | ○ | 20 | 6 | 8 |
| Example 9 | (9) | P9 | Absence | Absence | ○ | ○ | ○ | ○ | 15 | 5 | 15 |
| Example 10 | (10) | P10 | Absence | Absence | ○ | ○○~○ | ○ | ○ | 15 | 5.5 | 10 |
| Example 11 | (11) | P11 | Absence | Absence | ○ | ○○ | ○ | ○○ | 15 | 6 | 7 |
| Example 12 | (12) | P12 | Absence | Absence | ○ | ○ | ○ | ○ | 30 | 4.5 | 17 |
| Example 13 | (13) | P13 | Absence | Absence | ○ | ○○~○ | ○ | ○ | 18 | 5 | 12 |
| Example 14 | (14) | P14 | Absence | Absence | ○ | ○○ | ○ | ○○ | 13 | 5.5 | 9 |
| Example 15 | (15) | P4 | Absence | (15) | ○ | ○ | ○ | ○ | 10 | 4 | 18 |
| Example 16 | (16) | P4 | Presence | Absence | ○ | ○ | Δ | ○○ | 20 | 8.5 | 5 |
| Example 17 | (17) | P5 | Presence | Absence | ○ | ○ | Δ | ○○ | 25 | 8 | 5 |
| Example 18 | (18) | P8 | Presence | Absence | ○ | ○ | Δ | ○○ | 25 | 8 | 7 |
| Example 19 | (19) | P11 | Presence | Absence | ○ | ○ | Δ | ○○ | 25 | 8 | 7 |
| Example 20 | (20) | P14 | Presence | Absence | ○ | ○ | Δ | ○○ | 30 | 7.5 | 7 |
| Comparative Example 1 | (R1) | (15) | Absence | Absence | ○ | X | X | Δ | 40 | 2.5 | 50 |
| Comparative Example 2 | (R2) | (16) | Absence | Absence | ○ | X | X | X | 35 | 3 | 40 |
| Comparative Example 3 | (R3) | (17) | Absence | Absence | ○ | Δ | X | Δ | 40 | 1.5 | 50 |
| Example 21 | (21) | P4 | Absence | Absence | ○ | ○ | ○ | ○ | 15 | 6 | 8 |
| Example 22 | (22) | P8 | Absence | Absence | ○ | ○ | ○ | ○ | 25 | 5.5 | 10 |
| Example 23 | (23) | P11 | Absence | Absence | ○ | ○ | ○ | ○ | 20 | 5.5 | 9 |

TABLE 4-continued

Examples 1 to 25 and Comparative Examples 1 to 3

| | Lithographic | Overcoat Layer | | | Evaluation Results | | | | | | |
| --- | --- | --- | --- | --- | --- | --- | --- | --- | --- | --- | --- |
| | | | | | | Gum Development | | | On-press Development | | |
| | | | | | | Gum | | | Printing | | |
| | Printing Plate Precursor | Specific Polymer Resin | Inorganic Stratiform Compound | Other Resin | Solution Stability | Development Property | Running Processing Property | Scratch Resistance | On-press Development Property | Durability (×10⁴ sheets) | Ink Receptivity (sheets) |
| Example 24 | (24) | P14 | Absence | Absence | ○ | ○ | ○ | ○ | 18 | 5 | 11 |
| Example 25 | (25) | P4 | Absence | (15) | ○ | ○ | ○ | ○ | 15 | 4.5 | 20 |

Examples 26 to 45 and Comparative Examples 4 to 6

1. Preparation of Lithographic Printing Plate Precursors (26) to (45) and (R4) to (R6)

Coating solution (2) for undercoat layer having the composition shown below was coated on Aluminum support (1) obtained as described above and dried at 100° C. for one minute to form an undercoat layer. The coating amount of the coating solution for undercoat layer was 10 mg/m².

<Coating Solution (2) for Undercoat Layer>

| Polymer (SP1) shown below | 0.87 g |
| --- | --- |
| Polymer (SP2) shown below | 0.73 g |
| Pure water | 1,000.0 g |

Polymer (SP1)

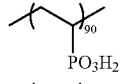

Mw: 6,000

Polymer (SP2)

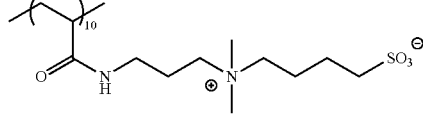

Mw: 9,000

Coating solution (3) for image-recording layer having the composition shown below was coated on the undercoat layer so as to have a dry coating amount of 1.4 g/m² and dried at 100° C. for one minute to form an image-recording layer.

<Coating Solution (3) for Image-recording Layer>

| Polymerizable compound (M-1) | 3.33 parts by weight |
| --- | --- |
| Binder polymer (B-1) (Mw: 47,000) | 2.67 parts by weight |
| Sensitizing dye (D-1) | 0.32 parts by weight |
| Polymerization initiator (I-1) | 0.61 parts by weight |
| Chain transfer agent (S-2) | 0.57 parts by weight |
| N-Nitrosophenylhydroxylamine aluminum salt | 0.020 parts by weight |
| Dispersion of ε-phthalocyanine [pigment: 15% by weight; dispersion agent (allyl methacrylate/methacrylic acid copolymer (molar ratio: 80/20, Mw: 60,000): 10% by weight; solvent (cyclohexanone/methoxypropyl acetate/1-methoxy-2-propanol = 15% by weight/ 20% by weight/40% by weight)] | 0.71 parts by weight |
| Fluorine-based nonionic surfactant (MEGAFAC F780F, produced by Dainippon Ink & Chemicals, Inc.)) | 0.016 part by weight |
| 2-Butanone | 47 parts by weight |
| Propylene glycol monomethyl ether | 45 parts by weight |

M-1 Mixture of the following compounds:

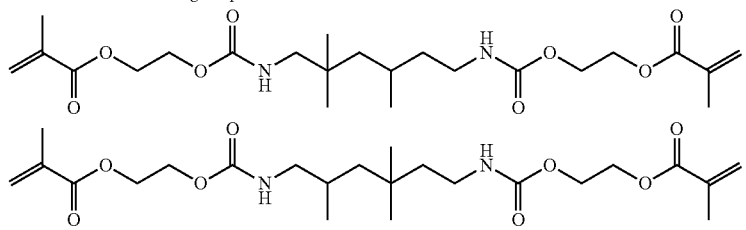

-continued

S-2
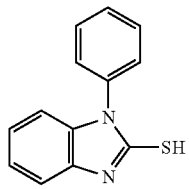 [SMILES: Sc1nc2ccccc2n1-c1ccccc1]

I-1
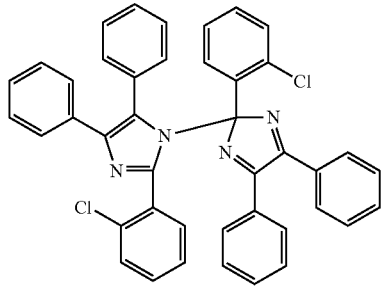 [SMILES: Clc1ccccc1-c1nc(-c2ccccc2)c(-c2ccccc2)n1C1(c2ccccc2Cl)N=C(c2ccccc2)C(c2ccccc2)=N1]

D-1
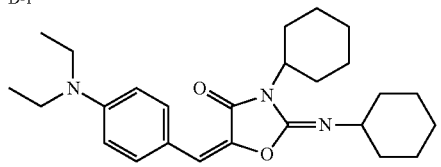

B-1
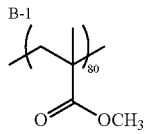

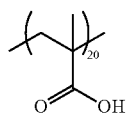

Then, Coating solution (1) for overcoat layer shown above was coated on the image-recording layer described above by a bar and dried in an oven at 120° C. for 60 seconds to form an overcoat layer having a dry coating amount of 0.50 g/m², thereby preparing Lithographic printing plate precursors (26) to (39) for Examples 26 to 39 and Lithographic printing plate precursors (R4) to (R6) for Comparative Examples 4 to 6, respectively. Further, Lithographic printing plate precursor (40) for Example 40 was prepared in the same manner as above except for using the coating solution for overcoat layer used in Lithographic printing plate precursor (15) in place of Coating solution (1) for overcoat layer.

Moreover, Coating solution (2) for overcoat layer shown above was coated on the image-recording layer described above by a bar and dried in an oven at 120° C. for 60 seconds to form an overcoat layer having a dry coating amount of 0.15 g/m², thereby preparing Lithographic printing plate precursors (41) to (45) for Examples 41 to 45, respectively.

2. Exposure, Development, Printing and Evaluation of Lithographic Printing Plate Precursor Each of the lithographic printing plate precursors was subjected to image exposure by Violet semiconductor laser plate setter Vx9600 (having InGaN semiconductor laser (emission wavelength: 405 nm±10 nm/output: 30 mW)) produced by FUJIFILM Electronic Imaging Ltd. (FFEI). The image drawing was performed at resolution of 2,438 dpi using FM screen (TAFFETA 20, produced by FUJIFILM Corp.) in a plate surface exposure amount of 0.05 mJ/cm² so as to have a halftone dot area rate of 50%.

The exposed lithographic printing plate precursor was subjected to preheating at 100° C. for 30 seconds and then subjected to development processing in the same manner as in the gum development of Example 1 using Developer 1 and the automatic development processor as shown in FIG. 1. The lithographic printing plate obtained was subjected to printing using a printing machine (SOR-M, produced by Heidelberg) and the development property, processing property and scratch resistance were evaluated. The results obtained are shown in Table 5.

TABLE 5

Examples 26 to 45 and Comparative Examples 4 to 6

| | Lithographic Printing Plate Precursor | Overcoat Layer Specific Polymer Resin | Overcoat Layer Inorganic Stratiform Compound | Overcoat Layer Other Resin | Evaluation Results Gum Development Gum Development Property | Evaluation Results Gum Development Running Processing Property | Scratch Resistance |
|---|---|---|---|---|---|---|---|
| Example 26 | (26) | P1 | Absence | Absence | ○ | ○ | ○ |
| Example 27 | (27) | P2 | Absence | Absence | ○ | ○ | ○ |
| Example 28 | (28) | P3 | Absence | Absence | ○○~○ | ○ | ○ |
| Example 29 | (29) | P4 | Absence | Absence | ○○ | ○ | ○○ |
| Example 30 | (30) | P5 | Absence | Absence | ○○ | ○ | ○ |
| Example 31 | (31) | P6 | Absence | Absence | ○ | ○ | ○ |
| Example 32 | (32) | P7 | Absence | Absence | ○○~○ | ○ | ○ |
| Example 33 | (33) | P8 | Absence | Absence | ○○ | ○ | ○ |
| Example 34 | (34) | P9 | Absence | Absence | ○ | ○ | ○ |
| Example 35 | (35) | P10 | Absence | Absence | ○○~○ | ○ | ○ |
| Example 36 | (36) | P11 | Absence | Absence | ○○ | ○ | ○○ |
| Example 37 | (37) | P12 | Absence | Absence | ○ | ○ | ○ |
| Example 38 | (38) | P13 | Absence | Absence | ○○~○ | ○ | ○ |
| Example 39 | (39) | P14 | Absence | Absence | ○○ | ○ | ○○ |
| Example 40 | (40) | P4 | Absence | (15) | ○ | ○ | ○ |
| Example 41 | (41) | P4 | Presence | Absence | ○ | Δ | ○○ |
| Example 42 | (42) | P5 | Presence | Absence | ○ | Δ | ○○ |
| Example 43 | (43) | P8 | Presence | Absence | ○ | Δ | ○○ |
| Example 44 | (44) | P11 | Presence | Absence | ○ | Δ | ○○ |
| Example 45 | (45) | P14 | Presence | Absence | ○ | Δ | ○○ |
| Comparative Example 4 | (R4) | (15) | Absence | Absence | Δ | X | Δ |
| Comparative Example 5 | (R5) | (16) | Absence | Absence | X | X | X |
| Comparative Example 6 | (R6) | (17) | Absence | Absence | Δ | X | Δ |

Examples 46 to 65 and Comparative Examples 7 to 9

1. Preparation of Lithographic Printing Plate Precursors (46) to (65) and (R7) to (R9)

Coating solution (4) for image-recording layer having the composition shown below was coated on the undercoat layer formed in the same manner as in Example 1 by a bar and dried in an oven at 100° C. for 60 seconds to form an image-recording layer having a dry coating amount of 1.0 g/m². Coating solution (4) for image-recording layer was a coating solution prepared by eliminating Infrared absorbing dye (1) from Coating solution (1) for image-recording layer.

Coating solution (4) for image-recording layer was prepared by mixing Photosensitive solution (2) shown below with Microgel solution (1) shown above just before the coating, followed by stirring.

<Photosensitive Solution (2)>

| | |
|---|---|
| Binder polymer (1) having structure shown above | 0.240 g |
| Radical polymerization initiator (1) having structure shown above | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown above | 0.050 g |
| Oil-sensitizing agent (Phosphonium compound (1) having structure shown above) | 0.055 g |
| Oil-sensitizing agent (Benzyl dimethyl octyl ammonium $PF_6$ salt | 0.018 g |
| Oil-sensitizing agent (Ammonium group-containing polymer having structure shown above (reduced specific viscosity: 44 ml/g) | 0.035 g |
| Fluorine-based surfactant (1) having structure shown above | 0.008 g |
| 2-Butanone | 1.091 g |
| 1-Methoxy-2-propanol | 8.609 g |

<Microgel Solution (1)>

| | |
|---|---|
| Microgel (1) | 2.640 g |
| Distilled water | 2.425 g |

Then, Coating solution (1) for overcoat layer shown above was coated on the image-recording layer described above by a bar and dried in an oven at 120° C. for 60 seconds to form an overcoat layer having a dry coating amount of 0.50 g/m², thereby preparing Lithographic printing plate precursors (46) to (59) for Examples 46 to 59 and Lithographic printing plate precursors (R7) to (R9) for Comparative Examples 7 to 9, respectively. Further, Lithographic printing plate precursor (60) for Example 60 was prepared in the same manner as above except for using the coating solution for overcoat layer used in Lithographic printing plate precursor (15) in place of Coating solution (1) for overcoat layer.

Moreover, Coating solution (2) for overcoat layer shown above was coated on the image-recording layer described above by a bar and dried in an oven at 120° C. for 60 seconds to form an overcoat layer having a dry coating amount of 0.15 g/m², thereby preparing Lithographic printing plate precursors (61) to (65) for Examples 61 to 65, respectively.

2. Exposure, Development, Printing and Evaluation of Lithographic Printing Plate Precursor On the lithographic printing plate precursor (size: 1,080 mm×800 mm) prepared was placed a lith film (900 mm×600 mm) and in Ushio printer (PS printer DS-P-806G, mercury lamp), after depressurization under a vacuum of 25 mm Hg for 30 seconds, exposure was conducted for 30 seconds. The lith film contained a solid image and a 50% halftone dot chart of a 20 μm-dot FM screen.

The exposed lithographic printing plate precursor was subjected to plate making be means of the on-press development and gum development, respectively, followed by performing the evaluations of on-press development property, printing durability and ink receptivity and the evaluations of gum development property, running processing property and scratch resistance in the same manner as in Example 1. The results obtained are shown in Table 6.

Description of Reference Numerals and Signs
4: Lithographic printing plate precursor (PS plate)
6: Developing unit
10: Drying unit
16: Carrying-in roller
20: Developing tank
22: Transport roller
24: Brush roller
26: Squeeze roller (carrying-out roller)
28: Backup roller
36: Guide roller
38: Skewer roller

TABLE 6

Examples 46 to 65 and Comparative Examples 7 to 9

| | Lithographic Printing Plate Precursor | Specific Polymer Resin | Overcoat Layer | | Evaluation Results | | | | | |
|---|---|---|---|---|---|---|---|---|---|---|
| | | | Inorganic Stratiform Compound | Other Resin | Gum Development | | | On-press Development | | |
| | | | | | Gum Development Property | Running Processing Property | Scratch Resistance | On-press Development Property | Printing Durability ($\times 10^4$ sheets) | Ink Receptivity (sheets) |
| Example 46 | (46) | P1 | Absence | Absence | ○ | ○ | ○ | 18 | 5.5 | 15 |
| Example 47 | (47) | P2 | Absence | Absence | ○ | ○ | ○ | 18 | 5.5 | 15 |
| Example 48 | (48) | P3 | Absence | Absence | ○○∼○ | ○ | ○ | 14 | 6.5 | 13 |
| Example 49 | (49) | P4 | Absence | Absence | ○○ | ○ | ○○ | 8 | 7.5 | 6 |
| Example 50 | (50) | P5 | Absence | Absence | ○○ | ○ | ○ | 10 | 7 | 8 |
| Example 51 | (51) | P6 | Absence | Absence | ○ | ○ | ○ | 23 | 6 | 20 |
| Example 52 | (52) | P7 | Absence | Absence | ○○∼○ | ○ | ○ | 20 | 6.5 | 12 |
| Example 53 | (53) | P8 | Absence | Absence | ○○ | ○ | ○ | 18 | 7 | 8 |
| Example 54 | (54) | P9 | Absence | Absence | ○ | ○ | ○ | 13 | 6 | 15 |
| Example 55 | (55) | P10 | Absence | Absence | ○○∼○ | ○ | ○ | 13 | 6.5 | 10 |
| Example 56 | (56) | P11 | Absence | Absence | ○○ | ○ | ○○ | 13 | 7 | 7 |
| Example 57 | (57) | P12 | Absence | Absence | ○ | ○ | ○ | 28 | 5.5 | 17 |
| Example 58 | (58) | P13 | Absence | Absence | ○○∼○ | ○ | ○ | 16 | 6 | 12 |
| Example 59 | (59) | P14 | Absence | Absence | ○○ | ○ | ○○ | 11 | 6.5 | 9 |
| Example 60 | (60) | P4 | Absence | (15) | ○ | ○ | ○ | 9 | 5 | 18 |
| Example 61 | (61) | P4 | Presence | Absence | ○ | Δ | ○○ | 18 | 9 | 5 |
| Example 62 | (62) | P5 | Presence | Absence | ○ | Δ | ○○ | 23 | 8 | 5 |
| Example 63 | (63) | P8 | Presence | Absence | ○ | Δ | ○○ | 23 | 8 | 7 |
| Example 64 | (64) | P11 | Presence | Absence | ○ | Δ | ○○ | 23 | 8 | 7 |
| Example 65 | (65) | P14 | Presence | Absence | ○ | Δ | ○○ | 28 | 7.5 | 7 |
| Comparative Example 7 | (R7) | (15) | Absence | Absence | Δ | X | Δ | 37 | 3.5 | 50 |
| Comparative Example 8 | (R8) | (16) | Absence | Absence | X | X | X | 32 | 4 | 40 |
| Comparative Example 9 | (R9) | (17) | Absence | Absence | Δ | X | Δ | 37 | 2.5 | 50 |

Industrial Applicability

According to the present invention, a lithographic printing plate precursor which is excellent in the gum development property, running processing property and scratch resistance and a lithographic printing plate precursor which is good in all performances of the on-press development property, ink receptivity, sensitivity and printing durability, and a method of producing thereof can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Mar. 26, 2010 (Japanese Patent Application No. 2010-073870) and a Japanese patent application filed on Jul. 30, 2010 (Japanese Patent Application No. 2010-173189), and the contents thereof are incorporated herein by reference.

The invention claimed is:

1. A lithographic printing plate precursor comprising a support, an image-recording layer containing a radical polymerization initiator and a radical polymerizable compound, and an overcoat layer containing a polymer resin,
wherein the polymer resin has a cloud point in an aqueous solution and includes a monomer unit containing at least any of an amino group and an amido bond, in this order,
wherein the monomer unit containing at least any of an amino group and an amido bond is represented by any of the following formulas (1) to (3):

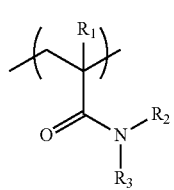

(1)

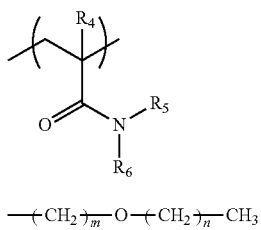

(2)

$$-(CH_2)_{\overline{m}}-O-(CH_2)_{\overline{n}}-CH_3$$ (A)

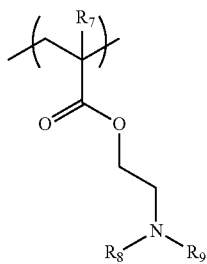

(3)

wherein, in formula (1), $R_1$ represents a hydrogen atom or a methyl group, and $R_2$ and $R_3$ each independently resents a hydrogen atom, a methyl group, an ethyl group, a n-propyl group, an isopropyl group, a n-butyl group, a sec-butyl group, an isobutyl group or a tert-butyl group, provided that at least one of $R_2$ and $R_3$ represents a methyl group, an ethyl group, a n-propvl group, an isopropyl group, a n-butyl group, a sec-butyl group, an isobutyl group or a tert-butyl group;

in formula (2), $R_4$ represents a hydrogen atom or a methyl group $R_5$ and $R_6$ each independently represents a hydrogen atom or an alkoxyalkyl group represented by formula (A), m represents an integer from 1 to 3, n represents an integer from 1 to 3, and m+n is 2, 3 or 4, provided that at least one of $R_5$ and $R_6$ represents an alkoxyalkyl group represented by formula (A); and in formula (3), $R_7$ represents a hydrogen atom or a methyl group, and $R_8$ and $R_9$ each independently represents a hydrogen atom, a methyl group, an ethyl group, a n-propyl group or an isopropyl group, provided that at least one of $R_8$ and $R_9$ represents a methyl group, an ethyl, a n-propyl group or an isopropyl group.

2. The lithographic printing plate precursor as claimed in claim 1, wherein the image-recording layer contains a sensitizing dye.

3. The lithographic printing plate precursor as claimed in claim 2, wherein the sensitizing dye is an infrared absorbing dye.

4. The lithographic printing plate precursor as claimed in claim 2, wherein the sensitizing dye is an ultraviolet absorbing dye.

5. The lithographic printing plate precursor as claimed in claim 3, which comprises a support, an image-recording layer containing an infrared absorbing dye, a radical polymerization initiator and a radical polymerizable compound and being removable with at least any of printing ink and dampening water, and an overcoat layer containing a polymer resin, wherein the polymer resin has a cloud point in an aqueous solution and includes a monomer unit containing at least any of an amino group and an amido bond, in this order.

6. The lithographic printing plate precursor as claimed in claim 1, wherein the overcoat layer contains an inorganic stratiform compound.

7. A method of producing the lithographic printing plate precursor as claimed in claim 1, comprising applying the image-recording layer containing a radical polymerization initiator and a radical polymerizable compound on the support, and then applying the overcoat layer containing a polymer resin, wherein the polymer resin has a cloud point in an aqueous solution and includes a monomer unit containing at least any of an amino group and an amido bond.

8. The method of producing a lithographic printing plate precursor as claimed in claim 7, wherein a drying temperature at the step of applying an overcoat layer is not lower than the cloud point of the polymer resin.

* * * * *